(12) United States Patent
Jang et al.

(10) Patent No.: US 11,689,205 B2
(45) Date of Patent: Jun. 27, 2023

(54) INTEGRATED CIRCUIT AND OPERATION METHOD THEREOF

(71) Applicant: Samsung Electronics Co., Ltd., Suwon-si (KR)

(72) Inventors: Wonsuk Jang, Hwaseong-si (KR); Hanseok Kim, Seoul (KR); Jaehyun Park, Seoul (KR); Hobin Song, Daejeon (KR); Jongshin Shin, Yongin-si (KR); Youngjin Chung, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/503,802

(22) Filed: Oct. 18, 2021

(65) Prior Publication Data
US 2022/0200605 A1    Jun. 23, 2022

(30) Foreign Application Priority Data

Dec. 18, 2020    (KR) ........................ 10-2020-0178914

(51) Int. Cl.
*H04L 1/20* (2006.01)
*H04L 25/03* (2006.01)
*H03L 7/08* (2006.01)
*H03L 7/081* (2006.01)
*H04L 1/00* (2006.01)

(52) U.S. Cl.
CPC .......... *H03L 7/0807* (2013.01); *H03L 7/0812* (2013.01); *H04L 1/0033* (2013.01); *H04L 1/0036* (2013.01); *H04L 1/203* (2013.01); *H04L 25/03019* (2013.01); *H04L 25/03885* (2013.01)

(58) Field of Classification Search
CPC ... H04L 1/0001; H04L 1/0033; H04L 1/0036; H04L 7/0079; H04L 25/03; H04L 25/03006; H04L 25/03012; H04L 25/03019; H04L 25/03343; H04L 25/03057; H04L 25/03885; H04L 25/0288; H04L 1/203; H04L 1/0015; H04B 17/309; H03L 7/0807; H03L 7/0812
See application file for complete search history.

(56) References Cited

U.S. PATENT DOCUMENTS

| | | | |
|---|---|---|---|
| 7,137,048 B2 | 11/2006 | Zerbe et al. | |
| 7,184,475 B2 | 2/2007 | Dohmen et al. | |
| 7,519,138 B2 | 4/2009 | Lee et al. | |
| 8,331,431 B2 * | 12/2012 | Suwada | H04L 25/03885 375/228 |

(Continued)

*Primary Examiner* — Betsy Deppe
(74) *Attorney, Agent, or Firm* — Harness, Dickey & Pierce, P.L.C.

(57) ABSTRACT

An integrated circuit may include a receiver configured to receive a first data signal based on an $m^{th}$ (where m is an integer of 1 or more) transmitter preset setting among a plurality of transmitter preset settings through an external link, and equalize and sample the first data signal; a receiver setting table including a plurality of combinations including values of a plurality of parameters related to the receiver; and a receiver control circuit configured to sequentially select the plurality of combinations with reference to the receiver setting table and set the plurality of parameters with the selected combinations.

20 Claims, 23 Drawing Sheets

(56) References Cited

U.S. PATENT DOCUMENTS

| | | |
|---|---|---|
| 8,605,847 B2 | 12/2013 | Mobin et al. |
| 8,917,803 B1 * | 12/2014 | Asuncion ................ H04L 7/033 375/232 |
| 8,923,463 B1 | 12/2014 | Jenkins et al. |
| 9,742,602 B2 | 8/2017 | Zerbe et al. |
| 10,103,911 B2 | 10/2018 | Shibasaki |
| 10,673,548 B2 | 6/2020 | Simpson |

* cited by examiner

| RX setting | C_1 | C_2 | ... | C_RN1 |
|---|---|---|---|---|
| CTLE/VGA EQ Parameter | V1_1 | V1_2 | | V1_RN1 |
| CTLE/DFE/VGA Current Parameter | V2_1 | V2_2 | | V2_RN1 |
| CTLE/DFE/VGA Load Parameter | V3_1 | V3_2 | | V3_RN1 |
| CDR Clock Phase Parameter | V4_1 | V4_2 | | V4_RN1 |

FIG. 4B

| RX setting | C_1a | C_2a | ... | C_RN1a | C_1b | C_2b | ... | C_RN1b |
|---|---|---|---|---|---|---|---|---|
| CTLE/VGA EQ Parameter | V1_1a | V1_2a | | V1_RN1a | V1_1b | V1_2b | | V1_RN1b |
| CTLE/DFE/VGA Current Parameter | V2_1a | V2_2a | | V2_RN1a | V2_1b | V2_2b | | V2_RN1b |
| CTLE/DFE/VGA Load Parameter | V3_1a | V3_2a | | V3_RN1a | V3_1b | V3_2b | | V3_RN1b |
| CDR Clock Phase Parameter | V4_1a | V4_2a | | V4_RN1a | V4_1b | V4_2b | | V4_RN1b |

TB2

STD_1 STD_2

FIG. 7B
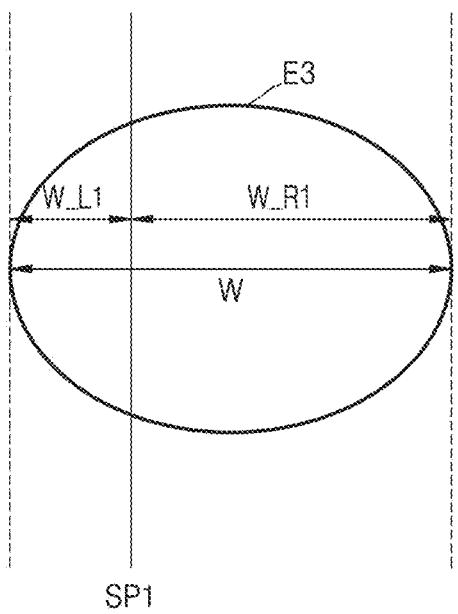
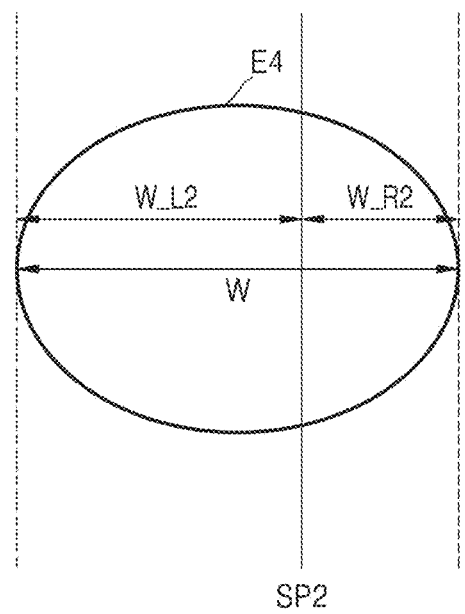

INTEGRATED CIRCUIT AND OPERATION METHOD THEREOF

CROSS-REFERENCE TO RELATED APPLICATION

This application is based on and claims priority under 35 U.S.C. application is based Application No. 10-2020-0178914, filed on Dec. 18, 2020, in the Korean Intellectual Property Office, the disclosure of which is incorporated by reference herein in its entirety.

BACKGROUND

The technical idea of the inventive concepts relates to an integrated circuit, and particularly, relates to an integrated circuit that performs a link adaptation operation on a receiving side during a link equalization process, and an operating method thereof.

In an operation of communication through a link between integrated circuits included in an electronic system or an operation of communication through a link within an integrated circuit, communication performance may be limited by a bandwidth of a channel. For example, signals transmitted through a high-performance link between integrated circuits may be degraded by various effects. The effects may include attenuation that reduces an amplitude of a pulse-response of the signals, dispersion that widens a pulse-response width of the signals, and reflections in which ripples occur after the pulse-response. The effects described above may vary depending on an operation environment of the electronic system (for example, process, voltage, and temperature (PVT) conditions), and the electronic system may perform a link equalization operation before communication to enable optimal communication in consideration of the operation environment. The link equalization operation may include an operation of finding an optimal transmitter preset in a transmission-side integrated circuit.

As the speed of an electronic system increases, intersymbol interference of the link increases, and thereby it is difficult to guarantee good communication performance only with a regular method of optimally setting the transmitter preset.

A problem to be solved by the technical idea of the inventive concepts is to provide an integrated circuit and an operation method thereof in which improved communication performance may be guaranteed by finding a combination of valid values of parameters on a receiving side together with a TX preset in a link equalization operation for communication between integrated circuits of an electronic system or within the integrated circuit.

An integrated circuit according to example embodiments of the inventive concepts may include a receiver configured to receive a first data signal based on a $m^{th}$ (where m is an integer greater than or equal to 1) transmitter preset setting among a plurality of transmitter preset settings through an external link, equalize and sample the first data signal; a receiver setting table including a plurality of combinations configured of values of a plurality of parameters related to the receiver; and a receiver control circuit configured to sequentially select the plurality of combinations with reference to the receiver setting table and set the plurality of parameters with the selected combination. The receiver control circuit selects a combination mapped to the $m^{th}$ transmitter preset setting among the plurality of combinations based on eye opening specifications of a plurality of second data signals output from the receiver as the plurality of parameters are sequentially set in the plurality of combinations.

An integrated circuit according to example embodiments of the inventive concepts may include a receiver configured to sequentially receive a plurality of first data signals based on each of a plurality of transmitter preset settings through an external link, equalize and sample the first data signals, and output a plurality of second data signals; a receiver setting table including a plurality of combinations configured of values of a plurality of parameters related to the receiver; and a receiver control circuit configured to sequentially select the plurality of combinations with reference to the receiver setting table, set a plurality of parameters with the selected combination, generate a phase code for checking eye opening specifications of the plurality of second data signals, and provide the phase code to the receiver. The receiver control circuit is configured to change a value of the phase code, compare a first bit error rate according to the changed value of the phase code with a target bit error rate, and generate eye opening specifications of the plurality of second data signals based on a comparison result.

An operation method of an integrated circuit according to example embodiments of the inventive concepts may include receiving a first data signal based on a $m^{th}$ (where m is an integer greater than or equal to 1) transmitter preset setting among a plurality of transmitter preset settings from an outside through a receiver; sequentially selecting a plurality of combinations including values of a plurality of parameters related to the receiver and setting the plurality of parameters as the selected combination; monitoring eye opening specifications of a plurality of second data signals generated from the first data signal through the receiver based on a bit error rate by using a phase code; and selecting a combination mapped to the $m^{th}$ transmitter preset setting among the plurality of combinations based on the monitoring result.

BRIEF DESCRIPTION OF THE DRAWINGS

Example embodiments of the inventive concepts will be more clearly understood from the following detailed description taken in conjunction with the accompanying drawings in which:

FIGS. 4A and 4B are table diagrams illustrating a receiver setting table of FIG. 1;

FIGS. 7A and 7B are diagrams illustrating examples of first to fourth eye patterns capable of distinguishing good and bad states when example embodiments of the inventive concepts are applied;

DETAILED DESCRIPTION OF EXAMPLE EMBODIMENTS

Hereinafter, example embodiments of the inventive concepts will be described in detail with reference to the accompanying drawings.

Figure 1:
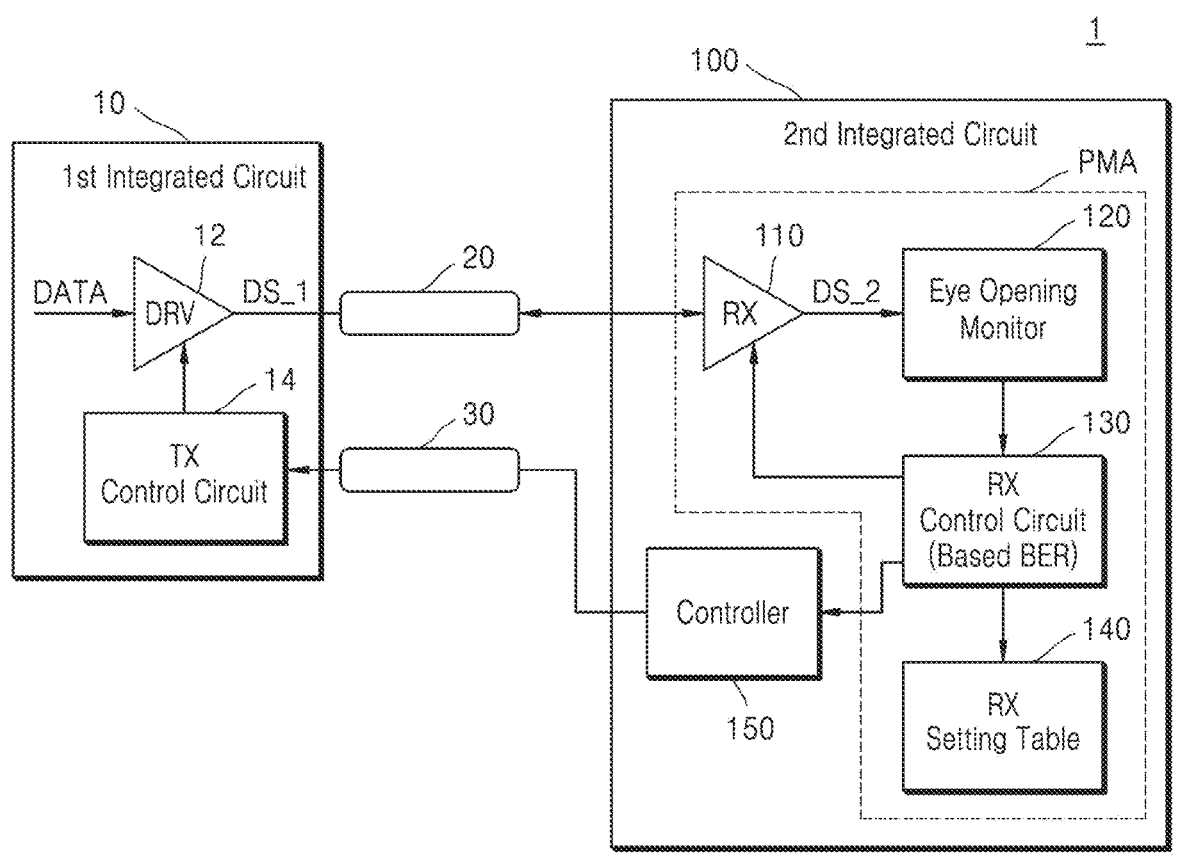
FIG. 1 is a block diagram schematically illustrating an electronic system according to example embodiments of the inventive concepts.

FIG. 1 is a block diagram schematically illustrating an electronic system 1 according to example embodiments of the inventive concepts. The electronic system 1 may be referred to as a signaling system.

Referring to FIG. 1, the electronic system 1 may include a first integrated circuit 10, a second integrated circuit 100, and/or first and/or second links 20 and 30. Hereinafter, for convenience of description, the first integrated circuit 10 is a pre-emphasizing transmitter, and the second integrated circuit 100 is an equalizing receiver. However, the first integrated circuit 10 may operate as a receiver to which example embodiments of the second integrated circuit 100 to be described later are applied, and the second integrated circuit 100 may operate as a transmitter to which example embodiments of the first integrated circuit 10 to be described later are applied. Further, the first and second links 20 and 30 may be referred to as first and second channels, respectively.

The first integrated circuit 10 may include a driver circuit 12 and a transmitter control circuit 14. The driver circuit 12 may pre-emphasize an input data DATA in consideration of an influence such as attenuation by the first link 20 and output the input data DATA as a first data signal DS_1. The transmitter control circuit 14 may select any one of a plurality of preset settings of the driver circuit 12 and control a pre-emphasis operation of the driver circuit 12 based on the selected preset setting. For example, the driver circuit 12 may include a main driver (not illustrated) and a plurality of sub-drivers (not illustrated). The main driver (not illustrated) outputs a main signal, and the plurality of sub-drivers (not illustrated) selectively and intensively emphases some or all of components of the main signal in consideration of an attenuation degree of the first link 20 to generate the sub-signals. The driver circuit 12 may synthesize the main signal and the sub-signals and output them as the first data signal DS_1.

In some example embodiments, the transmitter control circuit 14 may sequentially select a plurality of transmitter preset settings one by one in the link equalization process between the first integrated circuit 10 and the second integrated circuit 100 to control the driver circuit 12 based on the selected preset setting. The driver circuit 12 may sequentially transmit a plurality of first data signals DS_1 based on each of the plurality of transmitter preset settings to the second integrated circuit 100 through the first link 20.

In some example embodiments, the second integrated circuit 100 may provide a feedback signal indicating a result of performing an adaptive operation based on the technical idea of the inventive concepts with respect to the first data signals DS_1 received through the first link 20, to the transmitter control circuit 14 through the second link 30. In some example embodiments, the first link 20 may be a high-speed signal path, and the second link 30 may be a low-speed signal path. The transmitter control circuit 14 may select any one of the plurality of transmitter preset settings based on a signal received through the second link 30 to complete a link equalization operation. Hereinafter, it is assumed that a peripheral component interconnect express (PCIe) interconnection method applied to the electronic system 1, and the link equalization operation is performed in a recovery state defined in a PCIe standard specification. However, the technical idea of the inventive concepts to be described below may be sufficiently applied to other interconnection methods.

In some example embodiments, the second integrated circuit 100 may include a receiver 110, an eye opening monitor 120, a receiver control circuit 130, a receiver setting table 140, and/or a controller 150. The receiver 110 may receive the first data signal DS_1 based on any one, for example, $m^{th}$ (where, m is an integer greater than or equal to 1) preset setting of the plurality of transmitter preset settings through the link 20 during the link equalization operation. The receiver 110 may equalize and sample the first data signal DS_1 based on a plurality of preset parameters to provide the second data signal DS_2 to the eye opening monitor 120. The plurality of parameters are provided for the equalization and sampling operations related to the first data signal DS_1, and various values may be set by the receiver control circuit 130. For example, when the first link 20 has a characteristic of a low pass filter, the receiver 110 may enhance a component of a high frequency band of the first data signal DS_1. In some example embodiments, the eye opening monitor 120 may generate a signal indicating an eye pattern of the second data signal DS_2 to provide the signal to the receiver control circuit 130. The receiver control circuit 130 may provide a phase code whose value is changed, to the receiver 110 to check the eye pattern of the second data signal DS_2. Details about this will be described later.

In some example embodiments, the receiver setting table 140 may include a plurality of combinations configured of values of a plurality of parameters. A plurality of combinations may be pre-sorted through machine learning or the like, and be classified by a plurality of standards that may be supported by the second integrated circuit 100. The receiver setting table 140 may be stored in a nonvolatile memory (not illustrated) in the second integrated circuit 100 or may be loaded into a volatile memory (not illustrated) in the second integrated circuit 100.

In some example embodiments, the receiver control circuit 130 may control the receiver 110 so that a plurality of parameters are sequentially set to values corresponding to each of the plurality of combinations with reference to the receiver setting table 140. Accordingly, the receiver 110 may perform equalization and sampling operations corresponding to each of the plurality of combinations of the first data signal DS_1 to output the second data signals DS_2 as many as the number of the plurality of combinations. The eye opening monitor 120 may generate signals indicating eye patterns of the second data signals DS_2 to provide the signals to the receiver control circuit 130.

In some example embodiments, the receiver control circuit 130 may select a combination mapped to an $m^{th}$ transmitter preset setting among the plurality of combinations based on the eye opening specifications of the second data signals DS_2. The eye opening specification may indicate a timing margin or a voltage margin in the eye pattern of the data signal as a predetermined or alternatively, desired value. In some example embodiments, the eye opening specification may be expressed based on a value of a phase code provided to the receiver 110 in the receiver control circuit 130. The receiver control circuit 130 may determine good and bad conditions of the eye opening specifications that are difficult to distinguish based on only the phase code by analyzing the eye opening specifications based on a bit error rate and the phase code. Details about this will be described later. The receiver control circuit 130 may provide a signal related to the eye opening specification corresponding to the combination mapped to the $m^{th}$ transmitter preset setting, to the controller 150.

Thereafter, the second integrated circuit 100 may receive the first data signal DS_1 based on the next transmitter preset setting (for example, m+1th transmitter preset setting) from the first integrated circuit 10. The receiver control circuit 130 may select a combination mapped to the m+1th transmitter preset setting among the plurality of combinations by re-performing a sweep operation of the plurality of parameters described above. The receiver control circuit 130 may provide a signal related to the eye opening specification corresponding to the combination mapped to the m+1th transmitter preset setting.

In the above manner, the receiver control circuit 130 may provide signals corresponding to the eye opening specifications related to the combinations mapped to each of the plurality of preset settings, to the controller 150. The controller 150 may generate a feedback signal indicating the transmitter preset setting included in an optimal pair between a plurality of transmitter preset settings having the best eye opening specification and a plurality of combinations based on the received signals to provide the feedback signal to the first integrated circuit 10 through the second link 30.

The transmitter control circuit 14 may select the transmitter preset setting in the optimal pair among the plurality of preset settings based on the feedback signal, and the receiver control circuit 130 may select a combination in the optimal pair among the plurality of combinations. Therefore, the link equalization operation may be completed.

The receiver 110, the eye opening monitor 120, the receiver control circuit 130, and the receiver setting table 140 may be implemented with a physical medium attachment (PMA) in a physical layer. The controller 150 may be implemented with a data link layer which is an upper layer. The receiver 110, the eye opening monitor 120, the receiver control circuit 130, and/or the receiver setting table 140 may be implemented with hardware or software, and furthermore, may be implemented with a mixture of hardware/software. In some example embodiments, the controller 150 may control or execute the physical medium attachment (PMA).

The second integrated circuit 100 according to example embodiments of the inventive concepts may sweep the plurality of combinations configured of values of the plurality of parameters of the receiver 110 in the link equalization operation to find an optimal transmitter preset setting and a combination pair. Therefore, accurate adaptation with respect to the first link 20 is possible, and the time specified in the standard may be observed by sweeping only a plurality of selected combinations.

Figure 2:
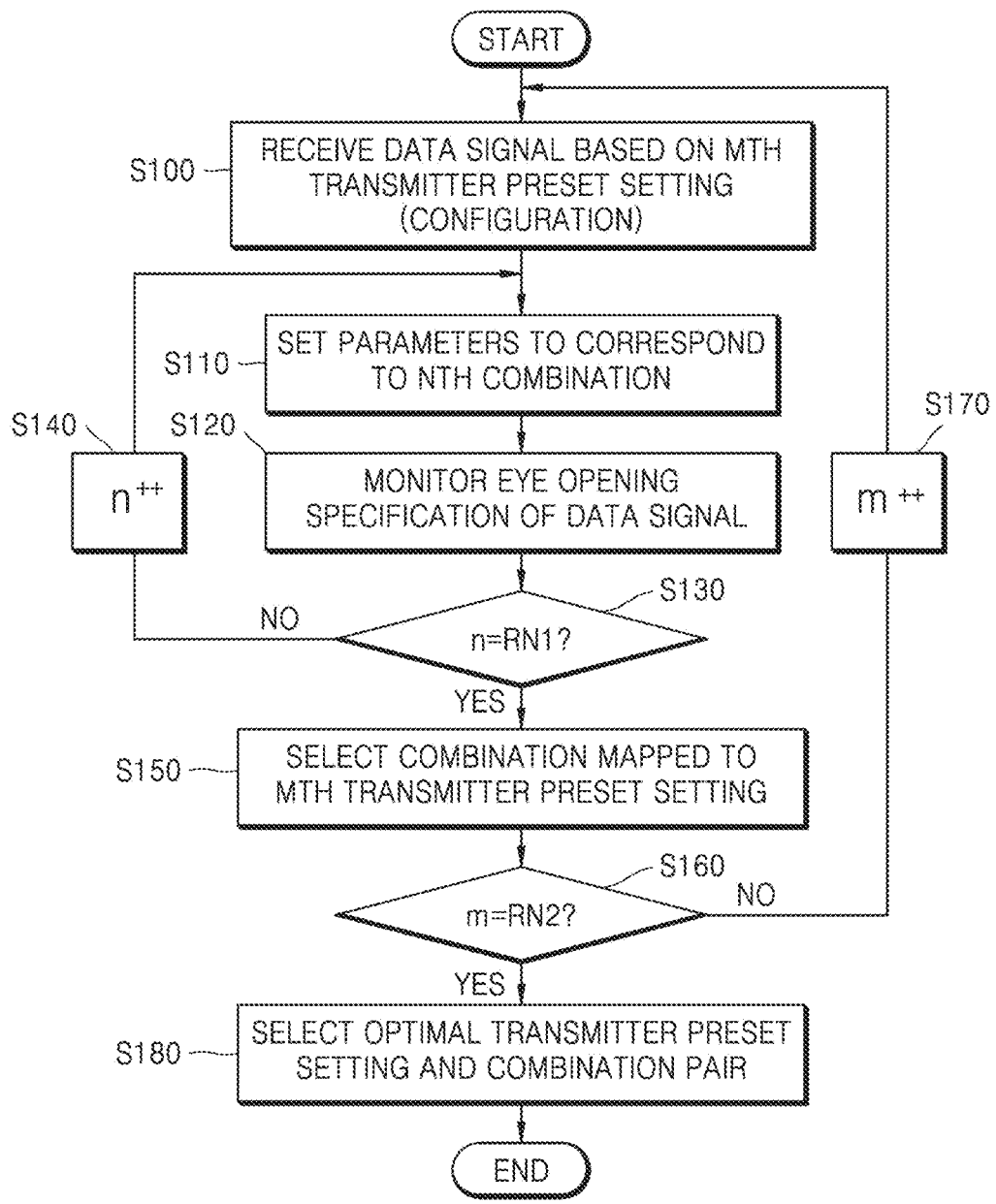
FIG. 2 is a flowchart for explaining an operation method of an integrated circuit, according to example embodiments of the inventive concepts.

FIG. 2 is a flowchart for explaining an operation method of an integrated circuit according to example embodiments of the inventive concepts.

Referring to FIG. 2, in operation S100, the integrated circuit may receive a data signal based on the $m^{th}$ transmitter preset setting (where m is an integer greater than or equal to 1). 'm' may be initially set to '1'. In operation S110, the integrated circuit may set a plurality of parameters related to the equalization or sampling operation with respect to the received data signal to have a value corresponding to an nth combination (where n is an integer greater than or equal to 1). 'n' may be initially set to '1'. In operation S120, the integrated circuit may be equalized depending on a plurality of parameters having a value of an nth combination, and monitor an eye opening specification of the sampled data signal. That is, the integrated circuit may monitor the eye opening specification with respect to the nth eye pattern of the data signal. In operation S130, the integrated circuit may determine whether 'n' has reached a first reference number RN1. The first reference number RN1 may correspond to the number of the plurality of combinations related to the plurality of parameters. That is, the integrated circuit may check whether all of the plurality of combinations have been swept through operation S130. When operation S130 is 'NO', operation S110 may be followed by counting up 'n' in operation S140. When operation S130 is 'YES', following operation S150, the integrated circuit may select the combination mapped to the $m^{th}$ transmitter preset setting among the plurality of combinations. In some example embodiments, the integrated circuit may check the eye opening specifications with respect to the eye patterns corresponding to the first reference number RN1, and map the combination corresponding to the best eye opening specification among them to the $m^{th}$ transmitter preset setting. In operation S160, the integrated circuit may determine whether 'm' has reached the second reference number RN2. The second reference number RN2 may correspond to the number of the plurality of transmitter preset settings. That is, the integrated circuit may check, through operation S160, whether all of the data signals according to the plurality of transmitter preset settings have been received and all link adaptation operations on the receiving side have been performed. When operation S160 is 'NO', in operation S170 the integrated circuit may count up 'm' to follow operation S100. When operation S160 is 'YES', in operation S180, the integrated circuit may check the eye opening specifications of combinations each mapped to the plurality of transmitter preset settings to select the optimal transmitter preset setting and the combination pair.

Figure 3:
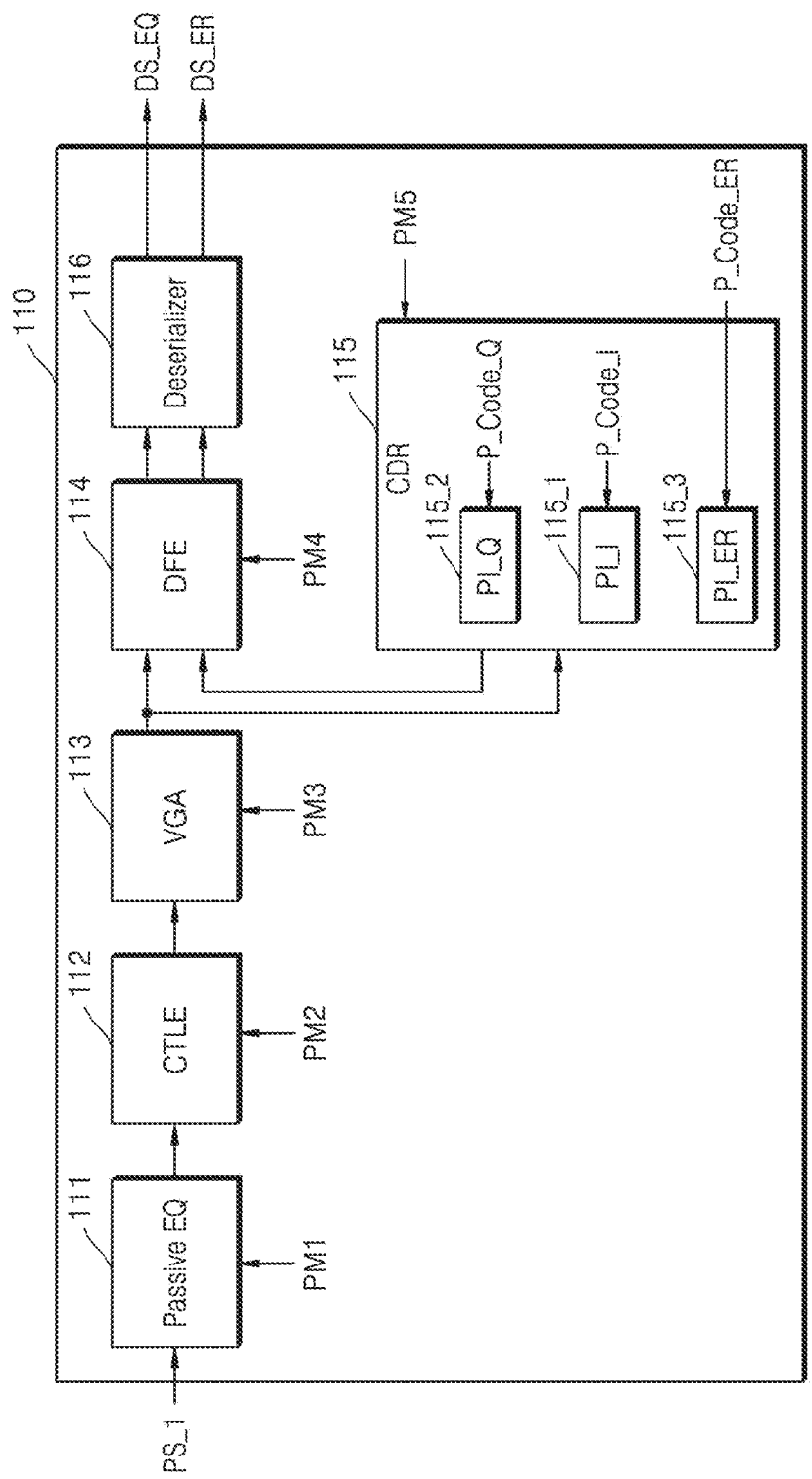
FIG. 3 is a block diagram illustrating example embodiments of a receiver of FIG. 1.

FIG. 3 is a block diagram illustrating example embodiments of the receiver 110 of FIG. 1.

Referring to FIG. 3, the receiver 110 may include a passive equalizer 111, a continuous time linear equalizer (CTLE) 112, a variable gain amplifier (VGA) 113, a decision feedback equalizer (DFE) 114, a clock/data recovery circuit 115, and/or a deserializer 116. The passive equalizer 111 operates based on a first parameter PM1, the continuous time linear equalizer 112 operates based on a second parameter PM2, the variable gain amplifier 113 operates based on a third parameter PM3, the decision feedback equalizer 114 operates based on a fourth parameter PM4, and the clock/data recovery circuit 115 operates based on a fifth parameter PM5.

First, the first data signal DS_1 may pass through the passive equalizer 111 and the continuous time linear equalizer 112 so that the component of the high frequency band may be enhanced. Thereafter, a gain of the first data signal DS_1 is adjusted through the variable gain amplifier 113 so that a magnitude of inter-symbol interference may be adjusted. Thereafter, the first data signal DS_1 is input to the clock/data recovery circuit 115, and the clock/data recovery circuit 115 may generate an inphase (I)-clock signal, a quadrature (Q)-clock signal, and an error clock signal for sampling the first data signal DS_1. In some example embodiments, the clock/data recovery circuit 115 may include an I-phase interpolator 115_1, a Q-phase interpolator 1152, and/or an error phase interpolator 115_3. The I-phase interpolator 115_1 may receive an I-phase code P_Code_I from the outside to generate an I-clock signal having a phase corresponding to the I-phase code P_Code_I. The Q-phase interpolator 1152 may receive a Q-phase code (P_Code_Q) having a value difference according to the I-phase code P_Code_I and the fifth parameter (PM5) to generate a Q-clock signal having a phase corresponding to the Q-phase code (P_Code_Q). In addition, the error-phase interpolator 115_3 may receive an error phase code P_Code_ER from the outside to generate an error clock signal having a phase corresponding to the error phase code P_Code_ER. The error clock signal may be a signal whose phase is gradually adjusted to check the eye pattern of the first data signal DS_1, and the phase code described in FIG. 1 may be the error phase code P_Code_ER. The I-clock signal and the Q-clock signal may be signals whose phases are gradually adjusted to find a sampling point in the eye pattern of the first data signal DS_1. The sampling point refers to a timing determined to sample an accurate value of the data signal, and the sampling point may vary depending on an operation environment of the integrated circuit including the receiver 110.

The decision feedback equalizer 114 may sample the first data signal DS_1 with the I-clock signal to generate sampling data, and sample the first data signal DS_1 with the error clock signal to generate error sampling data. The deserializer 116 may parallelize the sampling data and the error sampling data, respectively to output the equalized data signal DS_EQ and the error data signal DS_ER. The second data signal DS_2 of FIG. 1 may include the equalized data signal DS_EQ and the error data signal DS_ER.

FIGS. 4A and 4B are table diagrams illustrating the receiver setting table 140 of FIG. 1.

Referring to FIG. 4A, a first table TB1 may include first to RN1 combinations C_1 to C_RN1 configured of values of a plurality of parameters. For example, the plurality of parameters may include an equalization parameter CTLE/VGA EQ parameter) of a continuous time linear equalizer/variable gain amplifier, a current parameter (CTLE/DFE/VGA current parameter) of a continuous time linear equalizer/decision feedback equalizer/variable gain amplifier, a load parameter of a continuous time linear equalizer/decision feedback/variable gain amplifier, and a clock phase parameter (CDR clock phase parameter) of a clock/data recovery circuit. The first combination C_1 may be configured such that a plurality of parameters have a value of "V1_1" to a value of "V4_1", respectively. The second combination C_2 may be configured of a plurality of parameters having a value "V1_2" to a value "V4_2", respectively. The RN1 combination C_RN1 may be configured such that a plurality of parameters have a value "V1_RN1" to a value "V4_RN1", respectively. In the above manner, the third to RN1-1 combinations may be configured of the values of the plurality of parameters. In some example embodiments, the integrated circuit may sequentially sweep from the first combination C_1 to the RN1 combination C_RN1 in the link equalization operation to set the receiver. In some example embodiments, the integrated circuit may set a sweeping direction of the combinations to a direction in which a degree of equalization decreases, or the sweeping direction to a direction in which the degree of equalization increases.

Further referring to FIG. 4B, as in the second table TB2, a plurality of combinations C_1a to C_RN1a and C_1b to C_RN1b may be classified by a plurality of standards STD_1 and STD_2. In some example embodiments, the integrated circuit may support the first and second standards STD_1 and STD_2, and accordingly, the second table TB2 may include a plurality of combinations C_1a to C_RN1a, and C_1b to C_RN1b which may be respectively used in the first and second standards STD_1 and STD_2.

The integrated circuit may receive a signal related to a standard selected in the first and second standards (STD_1 and STD_2) when the link equalization operation starts or before the link equalization operation starts. The integrated circuit may use combinations corresponding to the selected standard to perform the link equalization operation. For example, when the first standard SID_1 is selected, the integrated circuit may perform the link equalization operation by sweeping a plurality of combinations C_1a to C_RN1a corresponding to the first standard SID_1. When the second standard SID_2 is selected, the integrated circuit may perform the link equalization operation by sweeping a plurality of combinations C_1b to C_RN1b corresponding to the second standard SID_2.

However, FIGS. 4A and 4B are only example embodiments, and the inventive concepts are not limited thereto, and the receiver setting table may include various combinations configured of values of a plurality of more various parameters, and these combinations may be classified to more standards.

FIGS. 5A to 5C and FIGS. 6A to 6C are diagrams for explaining operations of the integrated circuits 100a and 100b according to example embodiments of the inventive concepts. In FIGS. 5A to 5C and FIG. 6A to 6C, it is assumed that the integrated circuit 100a receives the first data signal DS_1m based on the $m^{th}$ transmitter preset setting, and the receiver control circuit 130' sets a plurality of parameters PM1n to PM5n with the nth combination C_n received by requesting the nth combination Req_C_n to the receiver setting table 140'. Hereinafter, contents overlapping with those in FIG. 3 will be omitted.

Figure 5A:
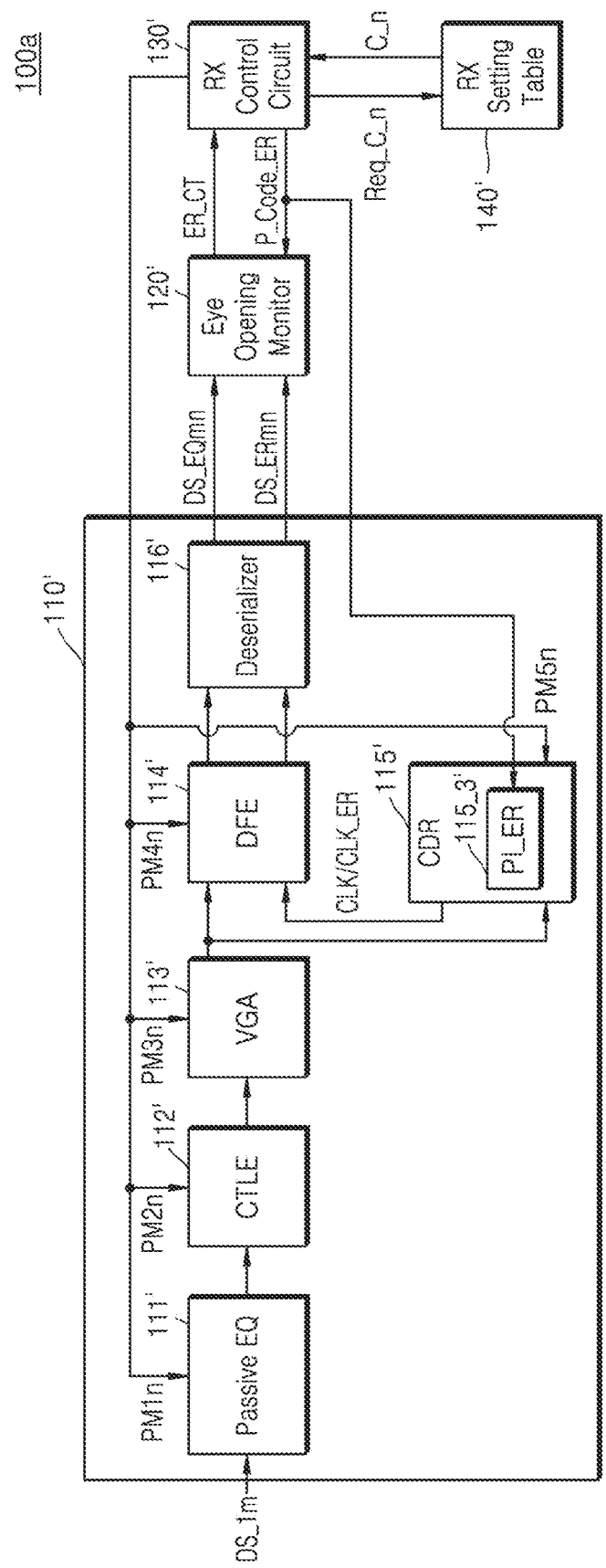
FIGS. 5A to 5C are diagrams for explaining operation of an integrated circuit according to example embodiments of the inventive concepts.

Referring to FIG. 5A, the first data signal DS_1m may be output as the data signal DS_EQmn and the error data signal DS_ERmn which are equalized through a passive equalizer 111', a continuous time linear equalizer 112', a variable gain amplifier 113', a decision feedback equalizer 114', and/or a deserializer 116'. For example, the receiver control circuit 130' may provide an error phase code P_Code_ER whose value is changed, to the error phase interpolator 115_3' included in the clock/data recovery circuit 115. The clock/data recovery circuit 115' may provide an error clock signal CLK_ER whose phase is changed based on the error phase code P_Code_ER, to the decision feedback equalizer 114'. Further, the clock/data recovery circuit 115' may provide the clock signal CLK including the I-clock signal and the Q-clock signal having a phase difference corresponding to the fifth parameter PM5n, to the decision feedback equalizer 114'.

The eye opening monitor 120' may perform a predetermined or alternatively, desired operation (for example, XOR operation) between the equalized data signal DS_EQmn and the error data signal DS_ERmn to generate an error count signal ER_CT, and provide the error count signal ER_CT to the receiver control circuit 130'. The receiver control circuit 130' may check the equalized data signal DS_EQmn based on the error count signal ER_CT, that is, the eye opening specification for the second data signal.

Figure 5B:
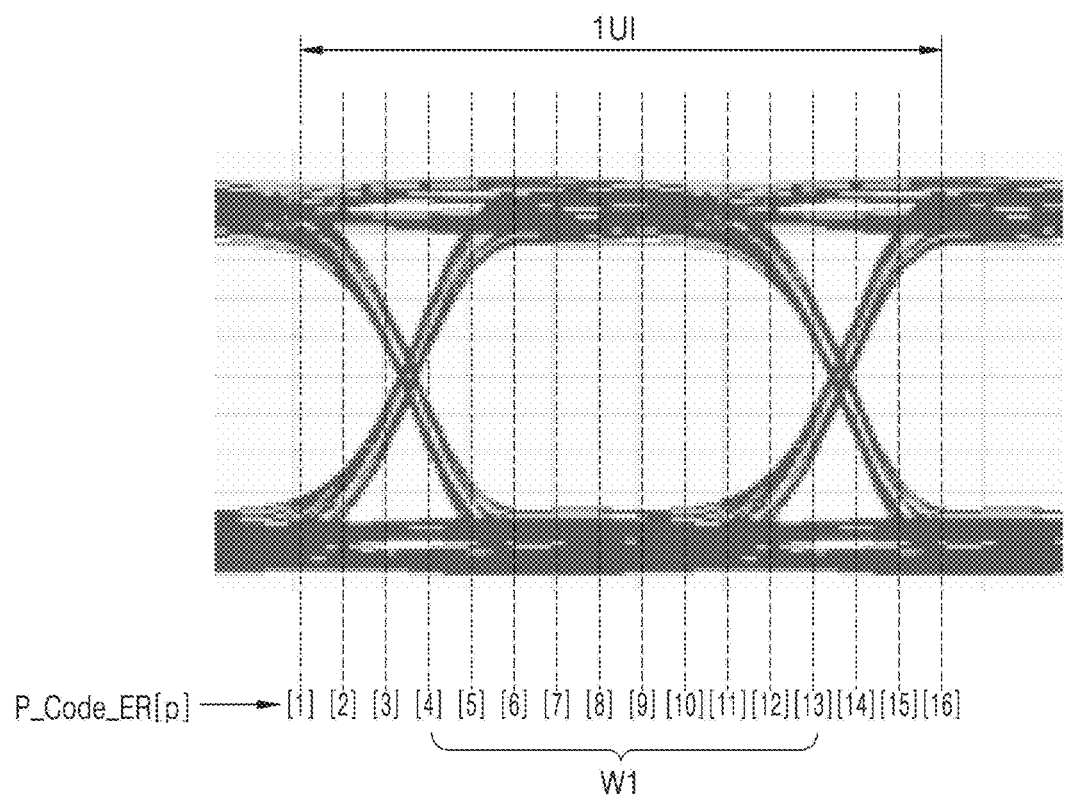

Referring to FIG. 5B, the receiver control circuit 130' may change an error phase code P_Code_ER[p] to values [1] to [16] during one unit interval (UI). The receiver control circuit 130' may check the width W1 of the eye pattern of the equalized data signal DS_EQmn based on the error count signal ER_CT generated as the value is changed. For example, the receiver control circuit 130' may check the error phase code P_Code_ER[p] at a point where the value of the error count signal ER_CT is changed, and check the width W1 based on this. As a result, the receiver control circuit 130' may confirm that the width W1 of the eye pattern of the equalized data signal DS_EQmn corresponds to a value difference between [4] and [13].

Figure 5C:
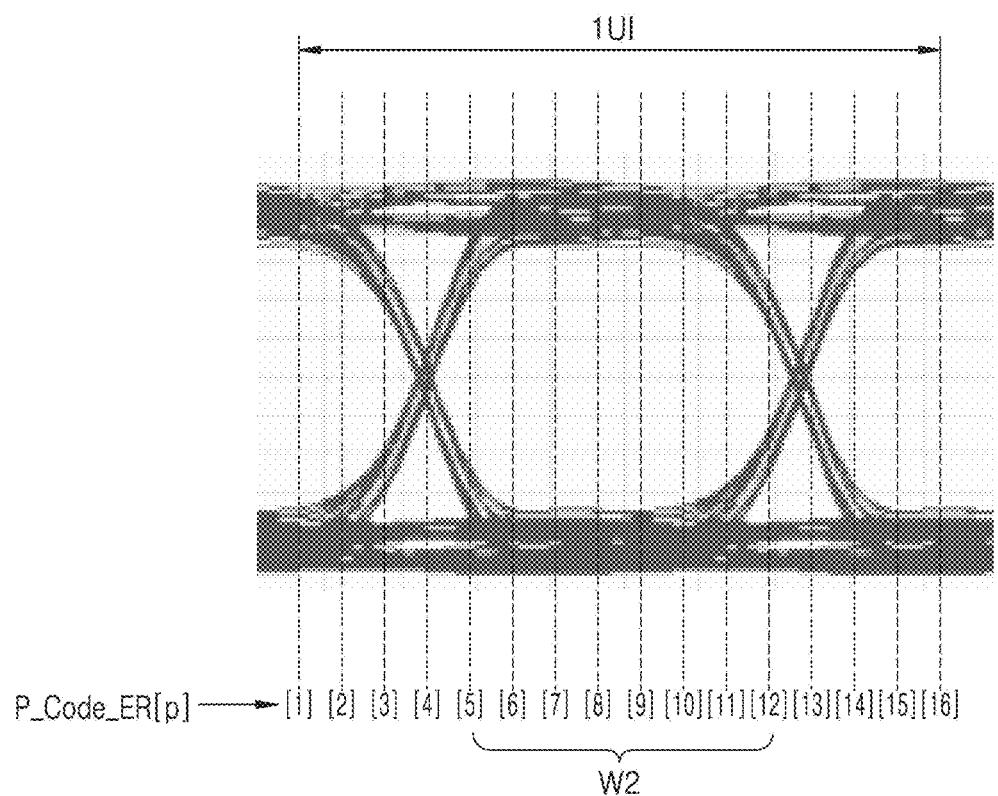

Further referring to FIG. 5c, the receiver control circuit 130' may change the error phase code (P_Code_ER[p]) to values [1] to [16] during one unit interval (UI). The receiver control circuit 130' may check the width W2 of the eye pattern of the equalized data signal DS_EQmn based on the error count signal ER_CT generated as the value is changed. That is, the receiver control circuit 130' may confirm that the width W2 of the eye pattern of the equalized data signal DS_EQmn corresponds to a value difference between [5] and [12].

Figure 6A:
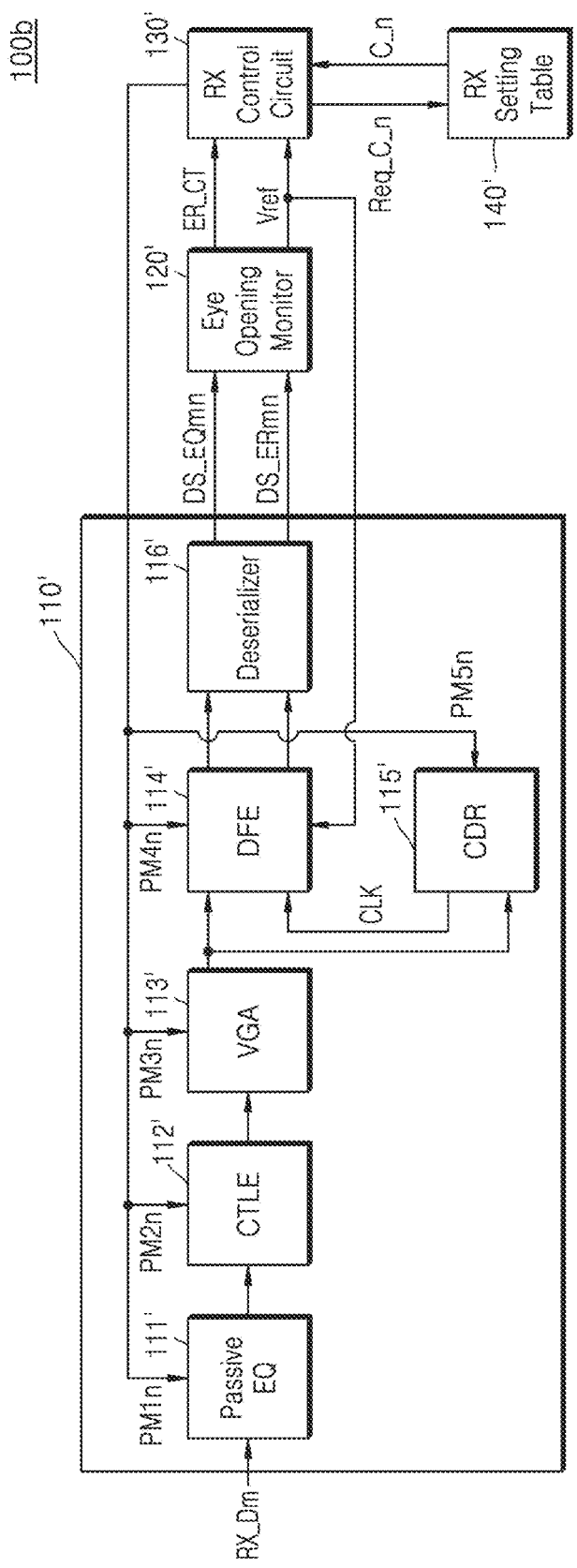
FIGS. 6A to 6C are diagrams for explaining operation of an integrated circuit according to example embodiments of the inventive concepts.

Referring to FIG. 6A, compared to FIG. 5A, the receiver control circuit 130' may provide a reference voltage Vref whose level is changed instead of the error phase code P_Code_ER.

Figure 6B:
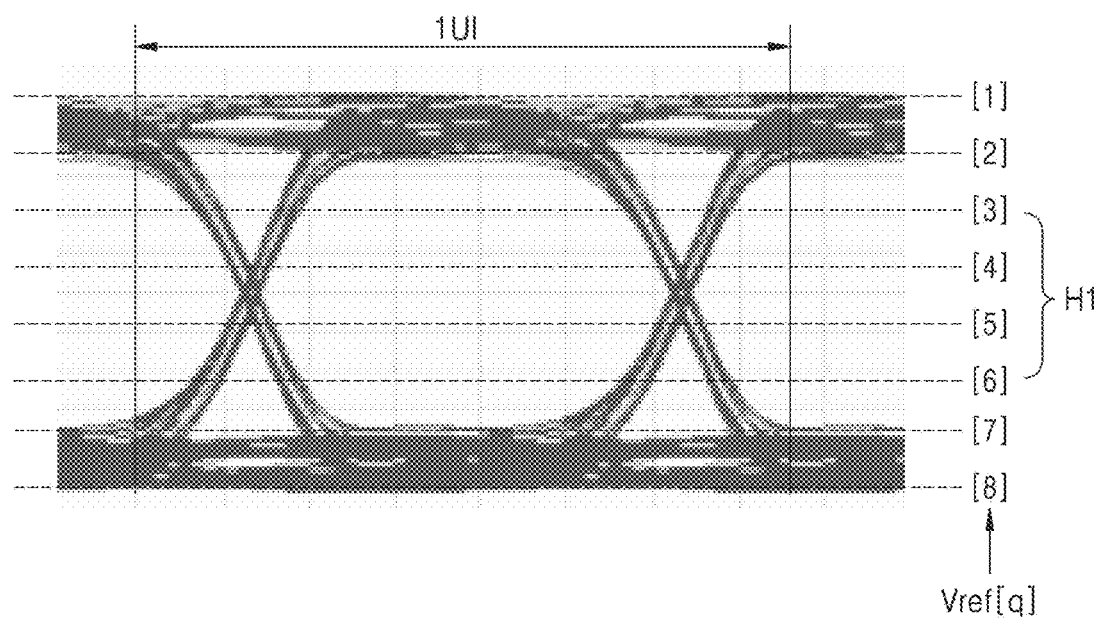

Further referring to FIG. 6B, the receiver control circuit 130' may change the reference voltage Vref [q] to levels [1] to [8]. The receiver control circuit 130' may check a height H1 of the eye pattern of the equalized data signal DS_EQmn based on the generated error count signal ER_CT as the level is changed. For example, the receiver control circuit 130' may check the reference voltage Vref[q] at a point where the value of the error count signal ER_CT is changed to check the height H1 based on this. As a result, the receiver control circuit 130' may confirm that the height H1 of the eye pattern of the equalized data signal DS_EQmn corresponds to the level difference between [2] and [7].

Figure 6C:
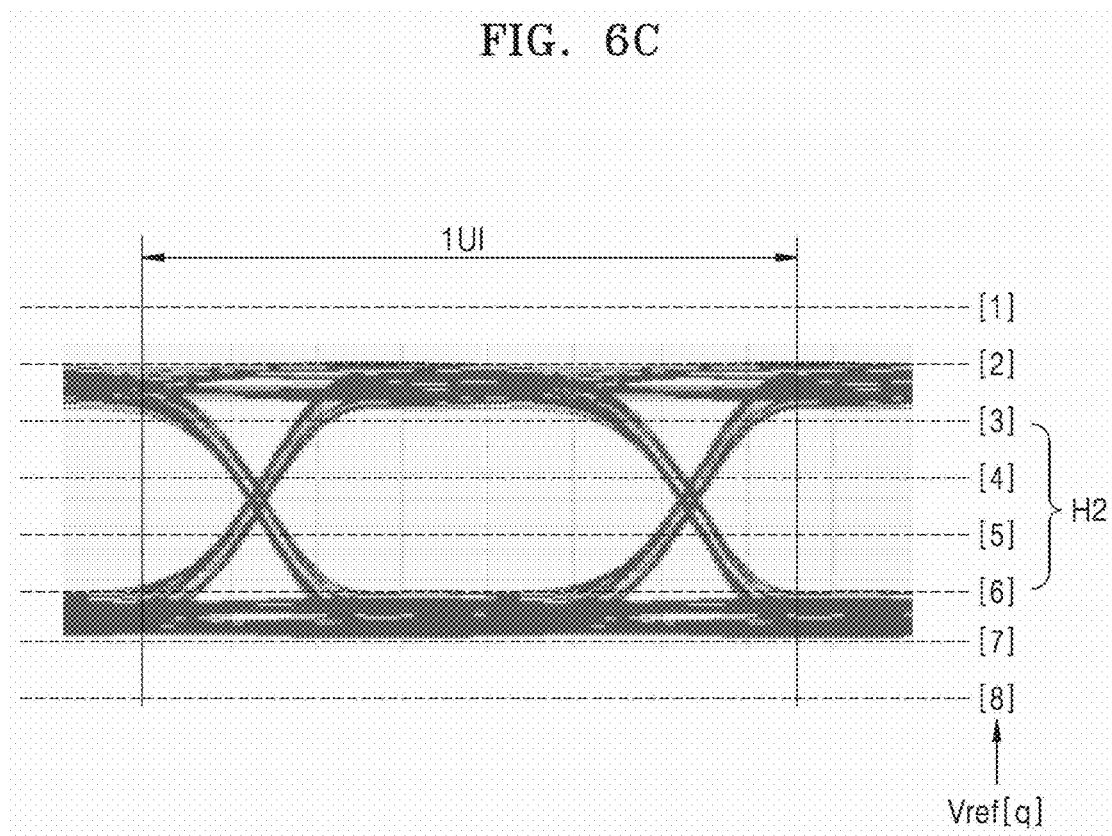

Further referring to FIG. 6C, the receiver control circuit 130' may change the reference voltage Vref[q] to levels [1] to [8]. The receiver control circuit 130' may check the height H2 of the eye pattern of the equalized data signal DS_EQmn based on the generated error count signal ER_CT as the level is changed. That is, the receiver control circuit 130' may confirm that the height H2 of the eye pattern of the equalized data signal DS_EQmn corresponds to the level difference between [3] and [6].

However, FIGS. 5A to 5C and FIGS. 6A to 6C are merely example embodiments, and the receiver control circuit 130' may use the error phase code P_Code_ER and the reference voltage Vref to check the width and the height of the eye pattern and determine the eye opening specification. Hereinafter, example embodiments of the inventive concepts to be described will be explained centering on checking the width of the eye pattern by the method described in FIGS. 5A to 5C, but are not limited thereto. It is clear that example embodiments of the inventive concepts may be applied to the example embodiments of FIGS. 6A to 6C, and to example embodiments in which FIG. 5A to FIG. 6C are integrated.

Figure 7A:
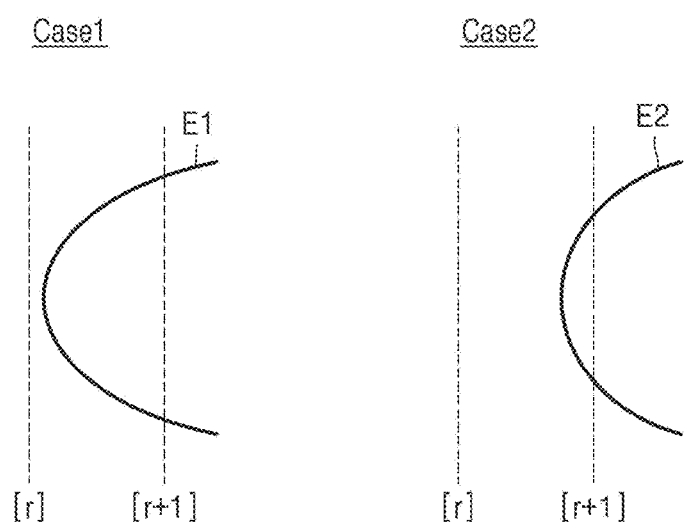

FIGS. 7A and 7B are diagrams illustrating examples of first to fourth eye patterns E1 to E4 capable of distinguishing good and bad states when example embodiments of the inventive concepts are applied. For reference, in FIG. 7A, only the left side of the first and second eye patterns E1 and E2 is illustrated.

Referring to FIG. 7A, when the widths of the first eye pattern E1 in the first case Case1 and the second eye pattern E2 in the second case Case2 are checked based on the error phase code, it may be checked to have the same width. Actually, since the width of the first eye pattern E1 is wider than the width of the second eye pattern E2, the first eye pattern E1 is in a better state than that of the second eye pattern E2. However, when checking the width based on only the error phase code, it is difficult to distinguish the state.

Further referring to FIG. 7B, the width W of the third eye pattern E3 in the third case Case3 is the same as the width W of the fourth eye pattern E4 in the fourth case Case4. In addition, the sampling point SP1 of the third eye pattern E3 is skewed to the left side, and the sampling point SP2 of the fourth eye pattern E4 is skewed to the right side. In some example embodiments, it is difficult to distinguish between good and bad states of the third eye pattern E3 and the fourth eye pattern E4 based on only the width.

In the integrated circuit according to example embodiments of the inventive concepts, in addition to checking the widths of the eye patterns E1 and E2 based on the error phase codes in the first and second cases Case1 and Case2, good and bad states of the eye patterns E1 and E2 may be determined based on the bit error rate at the [r] value corresponding to the starting point of the width in the eye patterns E1 and E2. For example, the bit error rate measured when the error phase code of the first eye pattern E1 has the [r] value may be smaller than that of the second eye pattern E2, and the integrated circuit may determine that the state of the first eye pattern E1 is better than the state of the second eye pattern E2.

In addition, in the integrated circuit according to example embodiments of the inventive concepts, in addition to checking the widths of the eye patterns E3 and E4 based on the error phase codes in the third and fourth cases Case3 and Case4, good and bad states of the eye patterns E3 and E4 may be determined by measuring left widths W_L1 and W_L2, and right widths W_R1 and W_R2 divided around the sampling points SP1 and SP2 of the eye patterns E3 and E4 and comparing the worse one-side widths with each other. This takes into account the tendency that the good and bad state of the eye pattern depend largely on the worse one-side width than the whole widths.

For example, the sampling point SP1 of the third eye pattern E3 is skewed to the left side, so the left width W_L1 may be shorter than the right width W_R1, and the sampling point SP2 of the fourth eye pattern E4 is skewed to the right side, so that the right width W_R2 may be shorter than a left width W_L2. The integrated circuit may compare the left width W_L1, which is the worse one-side width of the third eye pattern E3 with the right width W_R2, which is the worse one-side width of the fourth eye pattern E4 to distinguish good and bad of the states of the eye patterns E3 and E4. For example, when the right width W_R2 of the fourth eye pattern E4 is longer than the left width W_L1 of the third eye pattern E3, the integrated circuit may determine that the state of the fourth eye pattern E4 is better than the state of the eye pattern E3.

Figure 8:
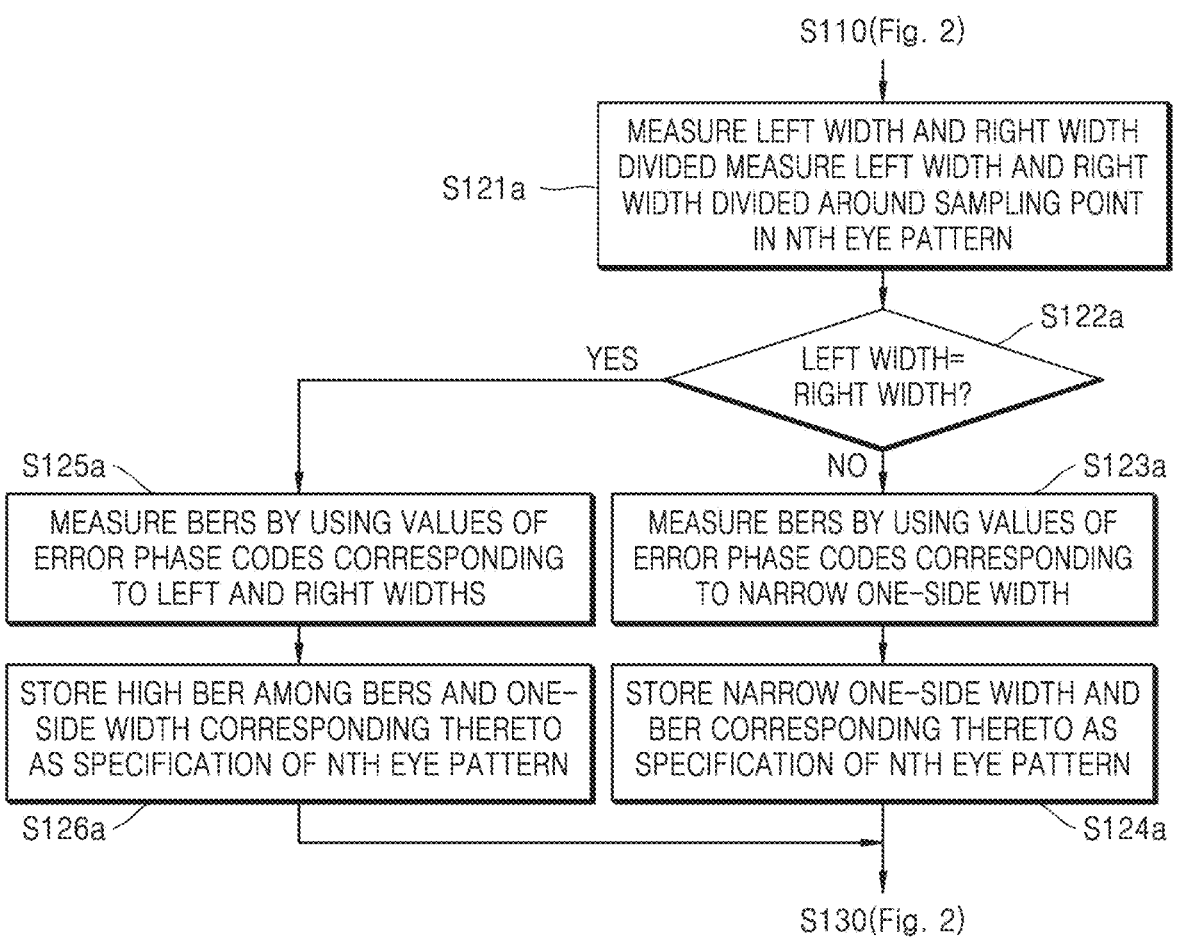
FIG. 8 is a flowchart illustrating an operation method of an integrated circuit according to example embodiments of the inventive concepts.

FIG. 8 is a flowchart for explaining an operation method of an integrated circuit according to example embodiments of the inventive concepts.

Referring to FIG. 8, in operation S121a following operation S110 of FIG. 2, the integrated circuit may measure the left width and the right width divided around the sampling point of the nth eye pattern of the data signal. In some example embodiments, the integrated circuit may measure the left width and the right width by finding values of the error phase codes that are measured closest to a predetermined or alternatively, desired target bit error rate. For example, the integrated circuit may measure the bit error rate of the data signals output from the receiver by changing the value of the error phase code in one direction using the value of the error phase code corresponding to the sampling point as a starting value with respect to the error phase code input to the receiver, and measure a difference between the start value and the last value as the left width by finding the last value of the error phase code that is measured closest to the target bit error rate. In addition, the integrated circuit may measure the bit error rate of the data signals output from the receiver by changing the value of the error phase code from the start value to another direction, and measure the difference between the start value and the last value as the right width by finding the last value of the error phase code that is measured closest to the target bit error rate. In some example embodiments, a binary search method may be applied such that the integrated circuit quickly measures the left width and the right width in consideration of the time constraints of the link equalization operation specified in the specification, and the target bit error rate may be set to a value higher than that of the target bit error rate to be a target specified in the standard specification. The target bit error rate may be variably set depending on the time of the link equalization operation specified in the standard specification.

In operation S122a, the integrated circuit may determine whether the left width and the right width are the same. When operation S122a is 'No', following operation S123a, the integrated circuit may measure the bit error rate by using the value of the error phase code corresponding to the narrow one-side width. In operation S124a, the integrated circuit may store the narrow one-side width and the bit error rate corresponding thereto as the specification of the nth eye pattern. In some example embodiments, the integrated circuit may store only the narrow one-side width as the specification of the nth eye pattern. When operation S122a is 'YES', following operation S125a, the integrated circuit may measure the bit error rates corresponding to each of the left and right widths by using the values of the error phase codes corresponding to the left and right widths. In operation S126a, the integrated circuit may store a high bit error rate among the measured bit error rates and the one-side width corresponding thereto as the specification of the nth eye pattern. In some example embodiments, the integrated circuit may store only one-side width as the specification of the nth eye pattern.

In some example embodiments, the integrated circuit may use the specification of the nth eye pattern when monitoring the eye opening specification of the data signal according to the (n+1)th combination. For example, after setting the receiver to the (n+1)th combination, the integrated circuit may skip measuring the left and right widths of the (n+1)th eye pattern, and use the one-side width in the specification of the nth eye pattern to perform the monitoring operation. The integrated circuit may be used when monitoring the eye opening specification of the data signal according to the next (n+2)th combination, when the (n+1)th bit error rate of the data signal according to the (n+1)th combination is higher than the nth bit error rate of the data signal according to the nth combination, as a result of using the one-side width in the specification of the nth eye pattern. The integrated circuit may determine that the specification of the nth eye pattern is better than the specification of the (n+1)th eye pattern. The integrated circuit may be continuously used when monitoring the eye opening specification of the data signal according to the next (n+2)th combination when the (n+1)th bit error rate is lower than the nth bit error rate and the difference therebetween is within the threshold range. The integrated circuit may determine that the specification of the (n+1)th eye pattern is better than the specification of the nth eye pattern. In addition, the integrated circuit may determine that the specification of the (n+1)th eye pattern is better than the specification of the nth eye pattern, when the (n+1)th bit error rate is lower than the nth bit error rate and the difference therebetween is out of the threshold range. The integrated circuit may use the one-side width of the (n+1)th eye pattern when monitoring the eye opening specification of the data signal according to the next (n+2)th combination, after measuring the specification of the (n+1)th eye pattern according to the (n+1)th combination based on binary search. In this way, the integrated circuit may quickly monitor the plurality of eye patterns according to each combination by sweeping the plurality of combinations.

Figure 9:
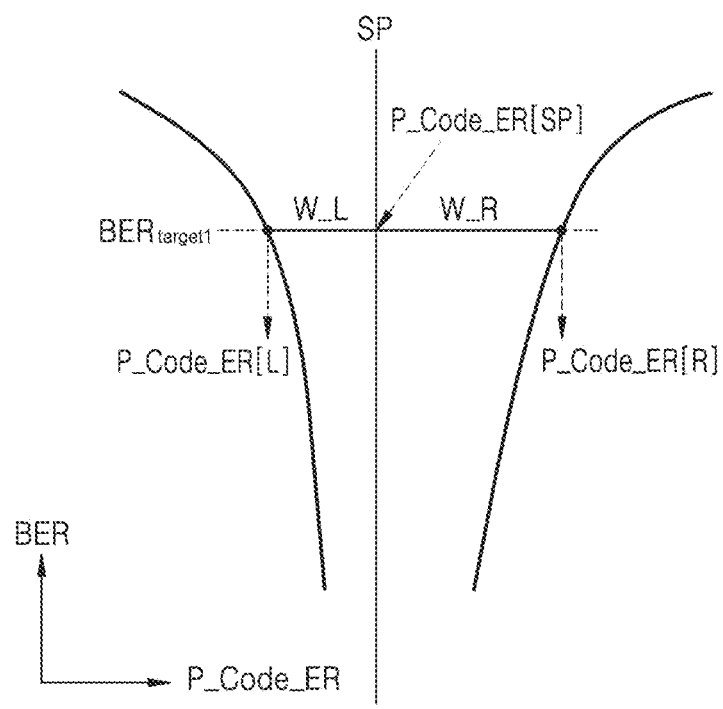
FIG. 9 is a diagram for explaining in detail a measuring method of a one-side width of an integrated circuit according to example embodiments of the inventive concepts.

FIG. 9 is a diagram for explaining in detail a measuring method of the one-side width of an integrated circuit according to example embodiments of the inventive concepts.

Referring to FIG. 9, the integrated circuit may find the value P_Code_ER[L] of the error phase code measured closest to the target bit error rate BERtargetl from the value P_Code_ER[SP] of the error phase code corresponding to the sampling point SP of the eye pattern to measure the left width W_L. In addition, the integrated circuit may find the value P_Code_ER[R] of the error phase code measured closest to the target bit error rate BERtargetl from the value P_Code_ER[SP] of the error phase code corresponding to the sampling point SP of the eye pattern to measure the right width W_R. In some example embodiments, the target bit error rate BERtargetl may be variably set depending on the operation environment of the integrated circuit. For convenience of understanding, the bit error rate of the equalized data signal DS_EQ output when the error phase code values P_Code_ER[L] and P_Code_ER[R] are applied to the receiver 110' (FIG. 3) is illustrated as being consistent with the target bit error rate BERtargel, but they may not be actually consistent therewith, and the difference between them may depend on the resolution of the error phase code.

Figure 10:
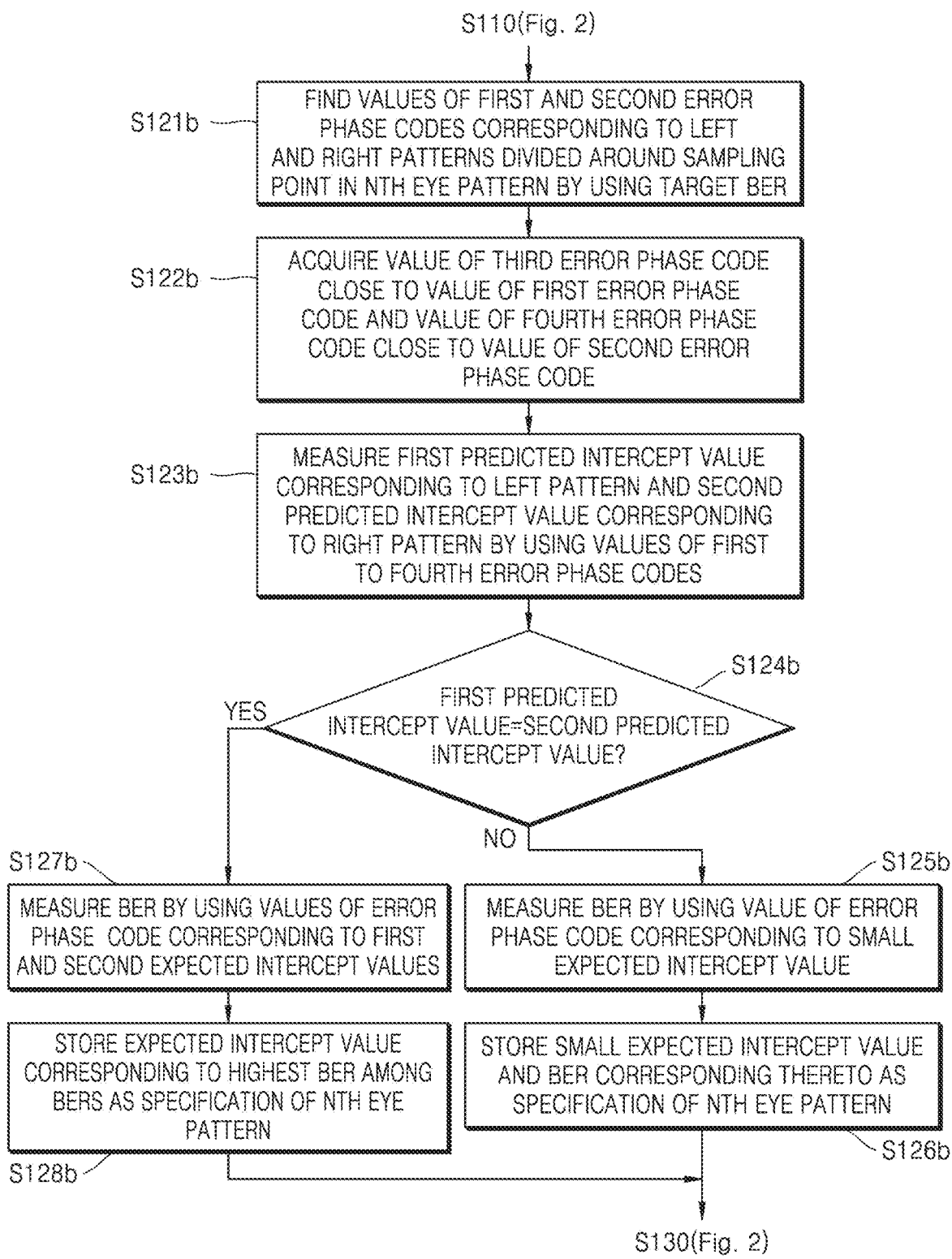
FIG. 10 is a flowchart illustrating an operation method of an integrated circuit according to example embodiments of the inventive concepts.

FIG. 10 is a flowchart for explaining an operation method of an integrated circuit according to example embodiments of the inventive concepts. In FIG. 10, example embodiments are described in which the integrated circuit selects a worse representative expected intercept value based on a change amount in bit error rate corresponding to the left pattern of the eye pattern and the bit error rate corresponding to the right pattern of the eye pattern. For example, when using a predetermined or alternatively, desired target bit error rate, the left width may be measured narrower than the right width, and it takes into account the tendency that the change amount in the bit error rate corresponding to the right pattern of the eye pattern is larger than the bit error rate corresponding to the left pattern of the eye pattern, so that the overall state of the eye pattern is largely dependent on the right pattern.

Referring to FIG. 10, in operation S121b following operation S110 of FIG. 2, the integrated circuit may find the values of first and second error phase codes corresponding to left and right patterns divided around the sampling point in the nth eye pattern by using the target bit error rate. In operation S122b, the integrated circuit may acquire the value of the third error phase code close to the value of the first error phase code and the value of a fourth error phase code close to the value of the second error phase code. For example, a difference between the value of the third error phase code and the value of the first error phase code, and the difference between the value of the fourth error phase code and the value of the second error phase code may be predetermined or alternatively, desired values. In operation S123b, the integrated circuit may measure the first predicted intercept value corresponding to the left pattern and the second predicted intercept value corresponding to the right pattern by using the values of the first to fourth error phase codes. On the other hand, the definition of the predicted intercept value and a specific measuring method thereof are described in FIG. 11. In operation S124b, the integrated circuit may determine whether the first predicted intercept value and the second predicted intercept value are the same. When operation S124b is 'No', following operation S125b, the integrated circuit may measure the bit error rate by using the value of the error phase code corresponding to the small expected intercept value. In operation S126b, the integrated circuit may select the small predicted intercept value as the representative predicted intercept value, and store the representative predicted intercept value and the bit error rate corresponding thereto as the specification of the nth eye pattern. In some example embodiments, the integrated circuit may store only the representative expected intercept value as the specification of the nth eye pattern. When operation S124b is 'YES', following operation S127b, the integrated circuit may measure the bit error rates by using the values of the error phase code corresponding to each of the first and second expected intercept values. In operation S128b, the integrated circuit may select the expected intercept value corresponding to the highest bit error rate among the measured bit error rates as the representative expected intercept value, and store the representative expected intercept value and the bit error rate corresponding thereto as the specification (or eye opening specification) of the nth eye pattern. In some example embodiments, the integrated circuit may store only the representative expected intercept value as the specification of the nth eye pattern. Thereafter, operation S130 of FIG. 2 is followed.

Figure 11:
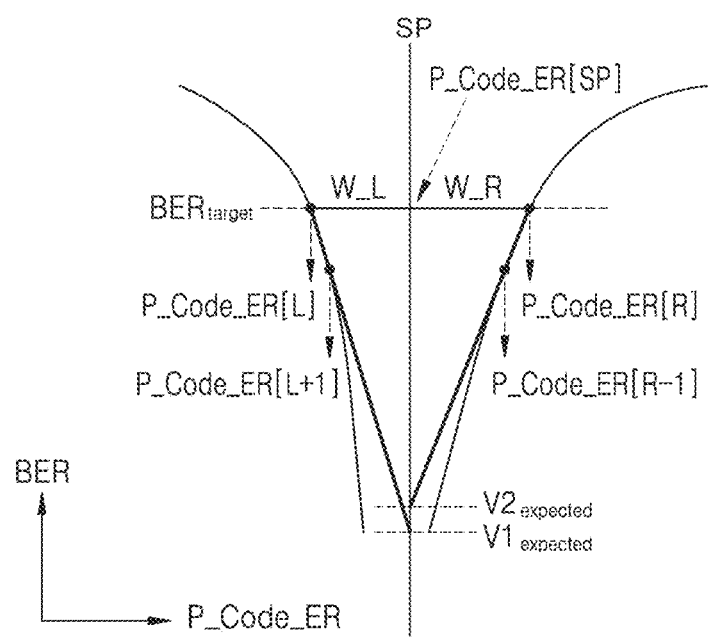
FIG. 11 is a diagram illustrating in detail a method of measuring predicted intercept values in FIG. 10.

FIG. 11 is a diagram for explaining in detail a measuring method of the predicted intercept values in FIG. 10.

Referring to FIG. 11, the integrated circuit provides the receiver with the error phase code that is changed by a predetermined or alternatively, desired value starting from the value P_Code_ER[SP] of the error phase code corresponding to the sampling point SP of the eye pattern. Therefore, a plurality of second data signals of are output from the receiver, and the value P_Code_ER[L] of the first error phase code corresponding to the second data signal including the left pattern having the bit error rate equal to or similar to the target bit error rate $BER_{target}$ among the plurality of second data signals may be found. In addition, the integrated circuit may find the value P_Code_ER[R] of the second error phase code corresponding to the second data signal including the right pattern equal to or similar to the target bit error rate $BER_{target}$ in the same manner as described above. That is, the value P_Code_ER[L] of the first error phase code may correspond to the left pattern of the eye pattern, and the value P_Code_ER[R] of the second error phase code may correspond to the right pattern of the eye pattern.

Thereafter, the integrated circuit may acquire the value P_Code_ER[L+1] of the third error phase code close to the value P_Code_ER[L] of the first error phase code and the value P_Code_ER[R−1] of the fourth error phase code close to the value P_Code_ER[R] of the second error phase code As described above, in some example embodiments, the difference between the values P_Code_ER[L] and P_Code_ER[L+1] of the first and third error phase codes and the difference between the values P_Code_ER[R] and P_Code_ER[R−1] of the second and fourth error phase codes may be promised in advance.

The integrated circuit may calculate the first change amount between the bit error rate measured from the second data signal output from the receiver when the value P_Code_ER[L] of the first error phase code is provided to the receiver, and the bit error rate measured from the second data signal output from the receiver when the value P_Code_ER[L+1] of the third error phase code is provided to the receiver. The integrated circuit may measure the first expected intercept value $V1_{expected}$ based on the first change amount. The integrated circuit may calculate a second change amount between the bit error rate measured from the second data signal output from the receiver when the value P_Code_ER[R] of the second error phase code is provided to the receiver and the bit error rate measured from the second data signal output from the receiver when the value P_Code_ER[R−1] of the fourth error phase code is provided to the receiver. The integrated circuit may measure the second expected intercept value $V2_{expected}$ based on the second change amount. In some example embodiments, the first predicted intercept value may correspond to the y-intercept value at a point where the function having the first change amount as a gradient and the y-axis at which the sampling point SP is extended, and the second predicted intercept value $V2_{expected}$ may correspond to the y-intercept value at a point where the function having the second change amount as a gradient and the y-axis at which the sampling point SP is extended.

In some example embodiments, the integrated circuit may select, as the representative expected intercept value, the second predicted intercept value $V2_{expected}$ when determining that the second predicted intercept value $V2_{expected}$ is less than the first predicted intercept value $V1_{expected}$. The integrated circuit may store the representative predicted intercept value and the bit error rate corresponding thereto as the specification (or eye opening specification) of the nth eye pattern.

Figure 12:
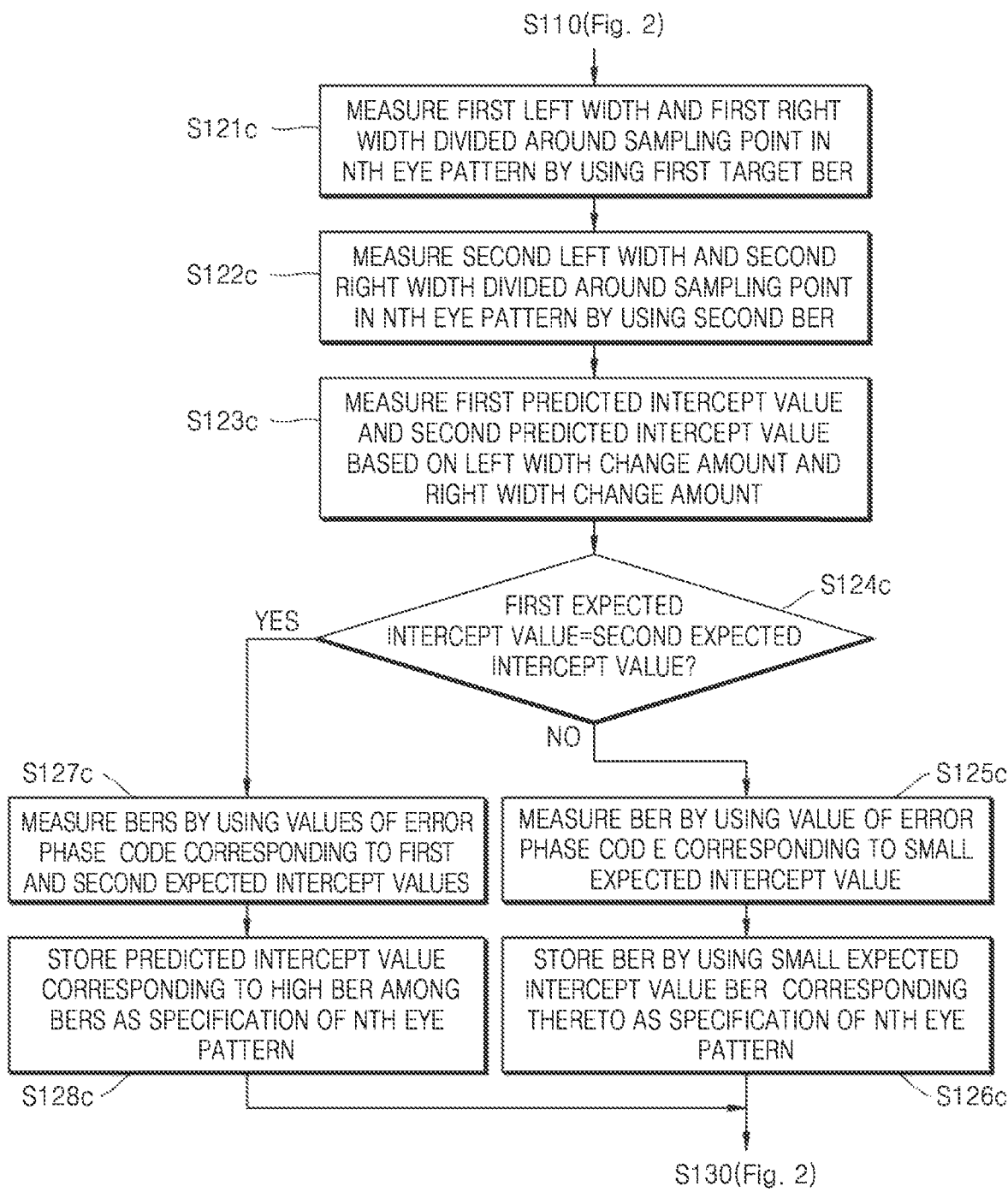
FIG. 12 is a flowchart for explaining an operation method of an integrated circuit according to example embodiments of the inventive concepts.

FIG. 12 is a flowchart for explaining an operation method of an integrated circuit according to example embodiments of the inventive concepts. In FIG. 12, example embodiments are described in which the integrated circuit selects the worse one-side width based on the change amount of the left width and the change amount of the right width of the eye pattern.

Referring to FIG. 12, in operation S121c following operation S110 of FIG. 2, the integrated circuit may measure the first left width and the first right width divided around the sampling point in the nth eye pattern by using the first target bit error rate. In operation S122c, the integrated circuit may measure the second left width and the second right width divided around the sampling point in the nth eye pattern by using the second target bit error rate. In operation S123c, the first predicted intercept value and the second predicted intercept value may be measured based on the left width change amount and the right width change amount.

In operation S124c, the integrated circuit may determine whether the first predicted intercept value and the second predicted intercept value are the same. When operation S124c is 'No', following operation S125b, the integrated circuit may measure the bit error rate by using the value of the error phase code corresponding to the small expected intercept value. In operation S126c, the integrated circuit may select the small predicted intercept value as the representative predicted intercept value, and store the representative predicted intercept value and the bit error rate corresponding thereto as the specification of the nth eye pattern. In some example embodiments, the integrated circuit may store only the expected representative intercept value as the specification of the nth eye pattern. When operation S124c is 'YES', following operation S127c, the integrated circuit may measure the bit error rates by using the values of the error phase codes corresponding to each of the first and second expected intercept values. In operation S128c, the integrated circuit may select the predicted intercept value corresponding to the high bit error rate among the measured bit error rates as the representative predicted intercept value, and store the representative predicted intercept value and the bit error rate corresponding thereto as the specification (or the eye opening specification) of the nth eye pattern. In some example embodiments, the integrated circuit may store only the representative expected intercept value as the specification of the nth eye pattern. Thereafter, operation S130 of FIG. 2 is followed.

Figure 13:
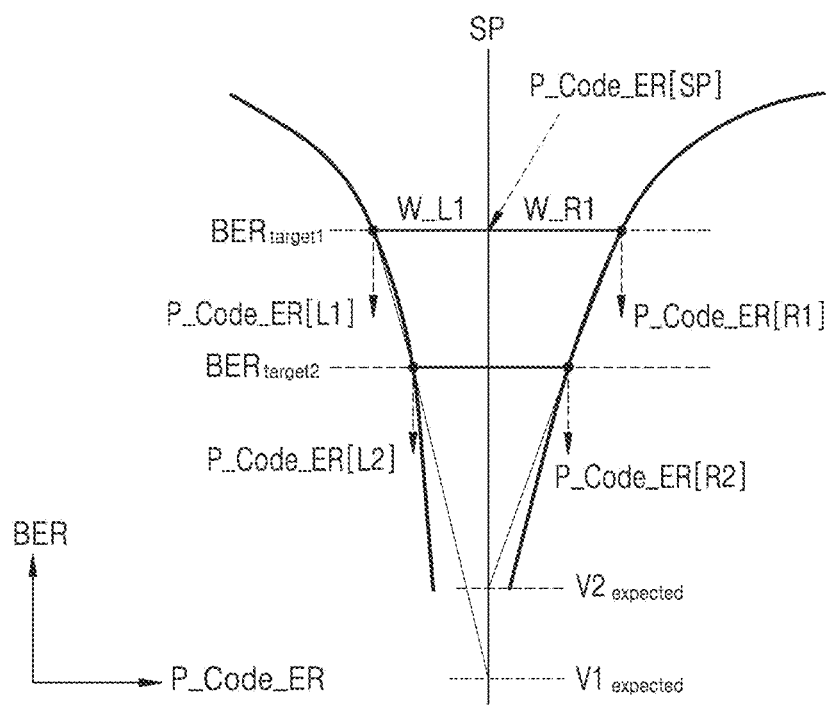
FIG. 13 is a diagram for explaining in detail a method of measuring predicted intercept values in FIG. 12.

FIG. 13 is a diagram for explaining in detail a measuring method of the predicted intercept values in FIG. 12.

Referring to FIG. 13, the integrated circuit may find the value P_Code_ER[L1] of the error phase code that is measured closest to the first target bit error rate $BER_{target1}$ from the value P_Code_ER[SP] of the error phase code corresponding to the sampling point SP of the eye pattern to measure the first left width W_L1. In addition, the integrated circuit may find the value P_Code_ER[R1] of the error phase code that is measured closest to the first target bit error rate $BER_{target1}$ from the value P_Code_ER[SP] of the error phase code corresponding to the sampling point SP of the eye pattern to measure the first right width W_R1. Thereafter, the integrated circuit may find the value P_Code_ER [L2] of the error phase code that is measured closest to the second target bit error rate $BER_{target2}$ from the value P_Code_ER[SP] of the error phase code corresponding to the sampling point SP of the eye pattern to measure the second left width W_L2. In addition, the integrated circuit may find the value P_Code_ER[R2] of the error phase code that is measured closest to the second target bit error rate $BER_{target2}$ from the value P_Code_ER[SP] of the error phase code corresponding to the sampling point SP of the eye pattern to measure the second left width W_R2.

The integrated circuit may measure a function having the change amount between the first and second left widths W_L1 and W_L2 as a gradient and a y-intercept value at a point where the y-axis at which the sampling point SP is extended is in contact therewith as the first expected intercept value $V1_{expected}$. In addition, the integrated circuit may measure a function having the change amount between the first and second right widths W_R1 and W_R2 as a gradient and a y-intercept value at a point where the y-axis at which the sampling point SP is extended is in contact therewith as a second expected intercept value $V2_{expected}$. In some example embodiments, when determining that the second predicted intercept value $V2_{expected}$ is less than the first predicted intercept value $V1_{expected}$, the integrated circuit may select the second predicted intercept value $V2_{expected}$ as the representative predicted intercept value and store the representative expected intercept value and the bit error rate corresponding thereto as the specification (or eye opening specification) of the nth eye pattern.

Figure 14:
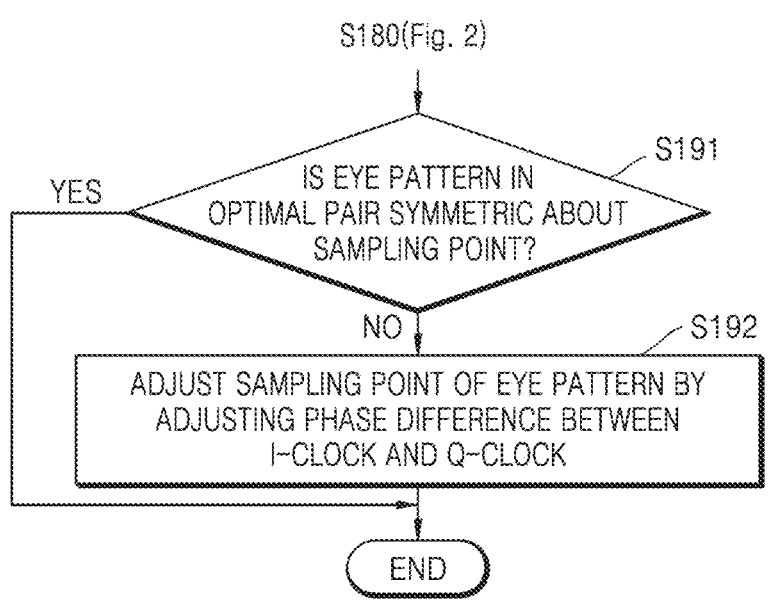
FIG. 14 is a flowchart for explaining an operation of adjusting a sampling point of an eye pattern of an integrated circuit according to example embodiments of the inventive concepts.

FIG. 14 is a flowchart for explaining an operation of adjusting a sampling point of an eye pattern of an integrated circuit according to example embodiments of the inventive concepts.

Referring to FIG. 14, in operation S191 following operation S180 of FIG. 2, the integrated circuit may determine whether the eye pattern in the optimal pair is symmetric about the sampling point. In some example embodiments, the integrated circuit may measure the left width and the right width of the eye pattern of the equalized data signal received in the optimal combination in the manner described in FIGS. 8 and 9, and determine whether the sampling point is symmetrical based on whether the left width and the right width match (or, whether the difference between the left width and the right width is less than or equal to the threshold value). Further, in some example embodiments, the integrated circuit may measure the first and second predicted intercept values of the eye pattern of the data signal received and equalized in the optimal combination in the manner described in FIG. 2 to determine whether the predicted intercept values are symmetric about the sampling point based on whether the predicted intercept values match (or whether the difference between the first and second predicted intercept values is less than or equal to the threshold value).

When operation S191 is 'No', following operation S192, the integrated circuit may adjust the sampling point of the eye pattern by adjusting the phase difference between the I-clock signal and the Q-clock signal. In some example embodiments, when the sampling point of the eye pattern is skewed to the left side, the integrated circuit may adjust the phase difference between the I-clock signal and the Q-clock signal in a direction in which the phase difference is decreased, and adjust the phase difference between the I-clock signal and the Q-clock signal in a direction in which the phase difference is increased. When operation S191 is 'YES', the integrated circuit may skip the operation of adjusting the sampling point of the eye pattern. Thereafter, operation S191 may be started periodically or aperiodically.

Figure 15:
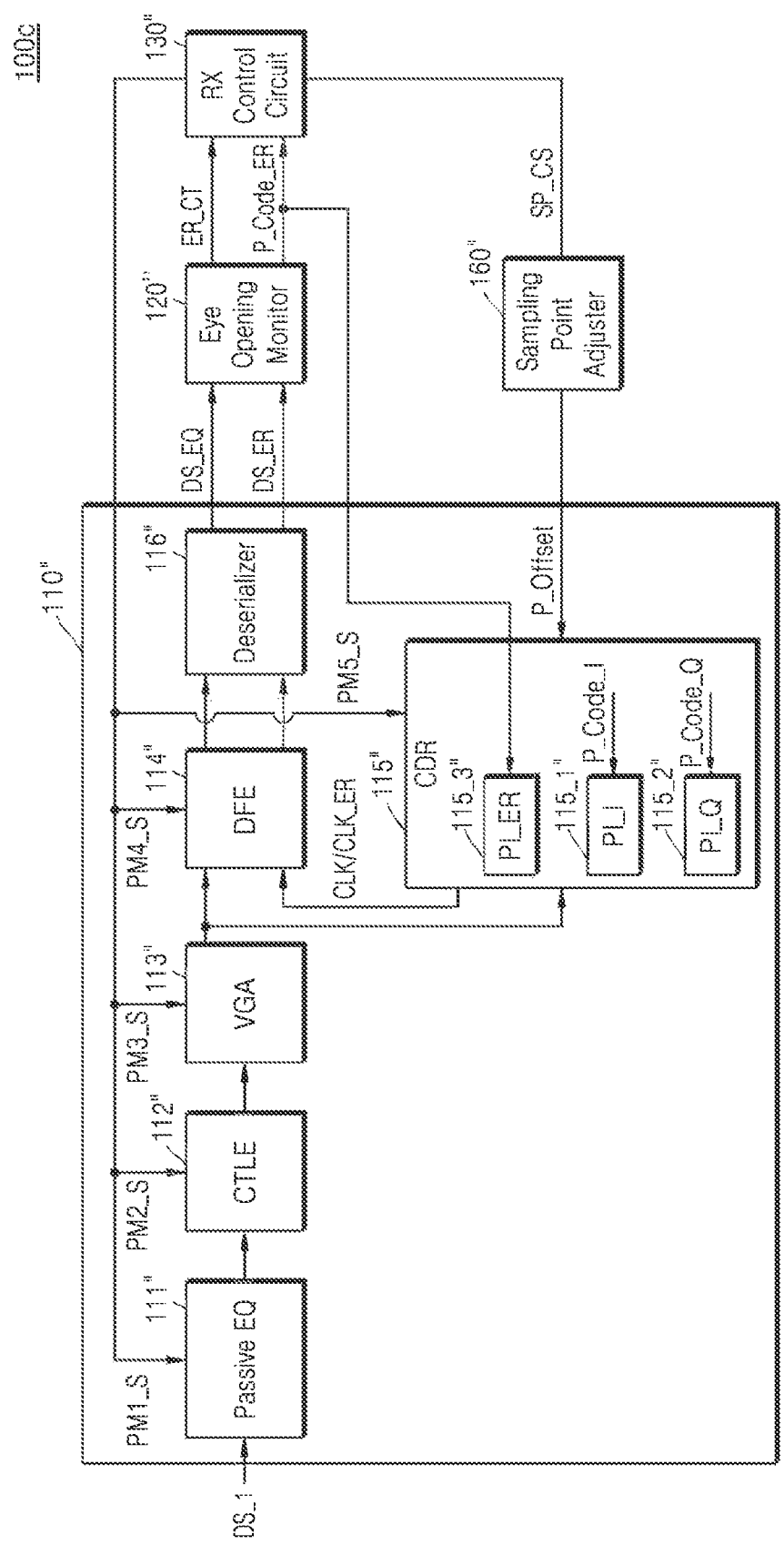
FIG. 15 is a block diagram illustrating an integrated circuit according to example embodiments of the inventive concepts.

FIG. 15 is a block diagram of an integrated circuit 100c according to example embodiments of the inventive concepts. In FIG. 15, it is assumed that the link equalization operation is completed, the receiver 110" receives the first data signal DS_1 based on the optimal preset setting, and the first to fifth parameters PM1_S to PM5_S are set as values of the optimal combination.

Referring to FIG. 15, the integrated circuit 100c may further include a sampling point adjuster 160" by comparing to the integrated circuit 100a of FIG. 5a. In some example embodiments, the first data signal DS_1 may pass through the receiver 110" and output as an equalized data signal DS_EQ and an error data signal DS_ER. The eye opening monitor 120" may generate the error count signal ER_CT by performing a predetermined or alternatively, desired operation between the equalized data signal DS_EQ and the error data signal DS_ER, and provide it to the receiver control circuit 130". The receiver control circuit 130" may check symmetry by comparing the left width and the right width divided around the sampling point of the eye pattern of the data signal DS_EQ equalized based on the error count signal ER_CT.

In some example embodiments, the receiver control circuit 130" may provide the sampling point control signal SP_CS to the sampling point adjuster 160" when the eye pattern is not symmetric. The sampling point adjuster 160" may provide a phase offset signal P_Offset to the clock/data recovery circuit 115" in response to the sampling point control signal SP_CS. The phase offset signal (P_Offset) is provided for additionally adjusting the phase difference between the I-clock signal and the Q-clock signal according to the fifth parameter (PM5_S), and the difference in values between the I-phase code P_Code_I and the Q-phase codes P_Code_Q may be adjusted by the phase offset signal P_Offset. In some example embodiments, the phase offset signal P_Offset may be implemented to finely adjust a phase difference between the I-clock signal and the Q-clock signal more than the fifth parameter PM5_S.

Figure 16:
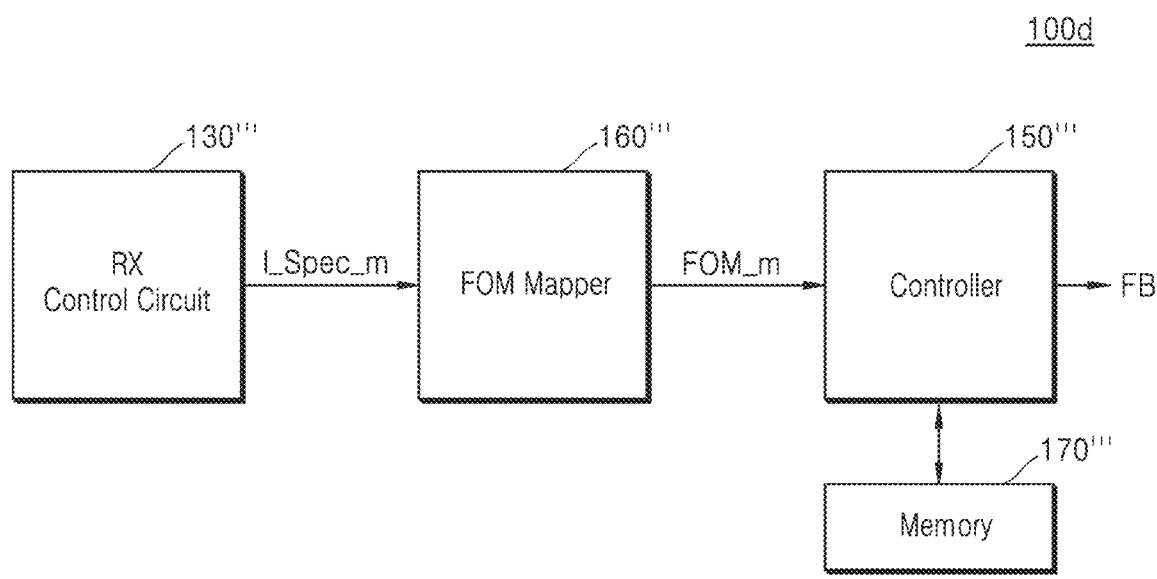
FIG. 16 is a block diagram illustrating an integrated circuit according to example embodiments of the inventive concepts.

FIG. 16 is a block diagram illustrating an integrated circuit 100d according to example embodiments of the inventive concepts. In FIG. 16, it is assumed that the receiver control circuit 130''' selects a combination mapped to the $m^{th}$ transmitter preset setting from the eye pattern of the equalized data signal DS_EQmn in FIG. 5A.

Referring to FIG. 16, the integrated circuit 100d may include a receiver control circuit 130''', a figure of merit (FOM) mapper 160''', a controller 150''', and/or a memory 170'''. The receiver control circuit 130''' may generate $m^{th}$ signal I_Spec_m related to the eye opening specification corresponding to the combinations mapped to the $m^{th}$ transmitter preset setting as a result of monitoring the eye opening specifications of the equalized data signals by sweeping the plurality of combinations described in FIG. 5A. In some example embodiments, the $m^{th}$ signal I_Spec_m may include information related to at least one of a height, a width, and an area of the eye pattern according to a mapped combination, and information related to the bit error rate. As an example, the information related to the width may include information indicating the entire width of the eye pattern or a worse one-side width, and the information related to the bit error rate may include information indicating the bit error rate measured based on the error phase code corresponding to the entire width of the eye pattern or a worse one-side width.

In some example embodiments, the FOM mapper 160''' may convert information included in the $m^{th}$ signal I_Spec_m into the $m^{th}$ FOM signal FOM_m having a format defined on the PCIe standard specification. In addition, the FOM mapper 160''' performs a comparison operation between signals including the $m^{th}$ signal I_Spec_m in order to determine an optimal pair between the plurality of transmitter preset settings and the plurality of combinations to continuously update the maximum value of the FOM of the internal register. In the future, the FOM maximum value may be referenced by the receiver control circuit to set the receiver to the optimal combination of pairs. In some example embodiments, the number of bits of the $m^{th}$ signal I_Spec_m may be greater than the number of bits of the $m^{th}$ FOM signal FOM_m. The controller 150''' compares the $m^{th}$ FOM signal FOM_m from the FOM mapper 160''' with the FOM signals received so far, and when the $m^{th}$ FOM signal FOM_m has the largest value, the $m^{th}$ FOM signal FOM_m may be stored in the memory 170'''. The previous FOM signal stored in the memory 170''' may be deleted. After receiving all the FOM signals corresponding to the plurality of transmitter preset settings, the controller 150''' may check the memory 170''' to generate the feedback signal FB indicating the transmitter preset setting included in the optimal pair between the plurality of transmitter preset settings and the plurality of combinations, and output the feedback signal FB to the outside (for example, the first integrated circuit 10 of FIG. 1). Accordingly, the first integrated circuit 10 (FIG. 1) may transmit the data signal based on the transmitter preset setting included in the optimal pair to the second integrated circuit 100d in response to the received feedback, and the second receiver control circuit 130''' of the integrated circuit 100d may set a plurality of parameters of the receiver with a combination included in the optimal pair.

Figure 17:
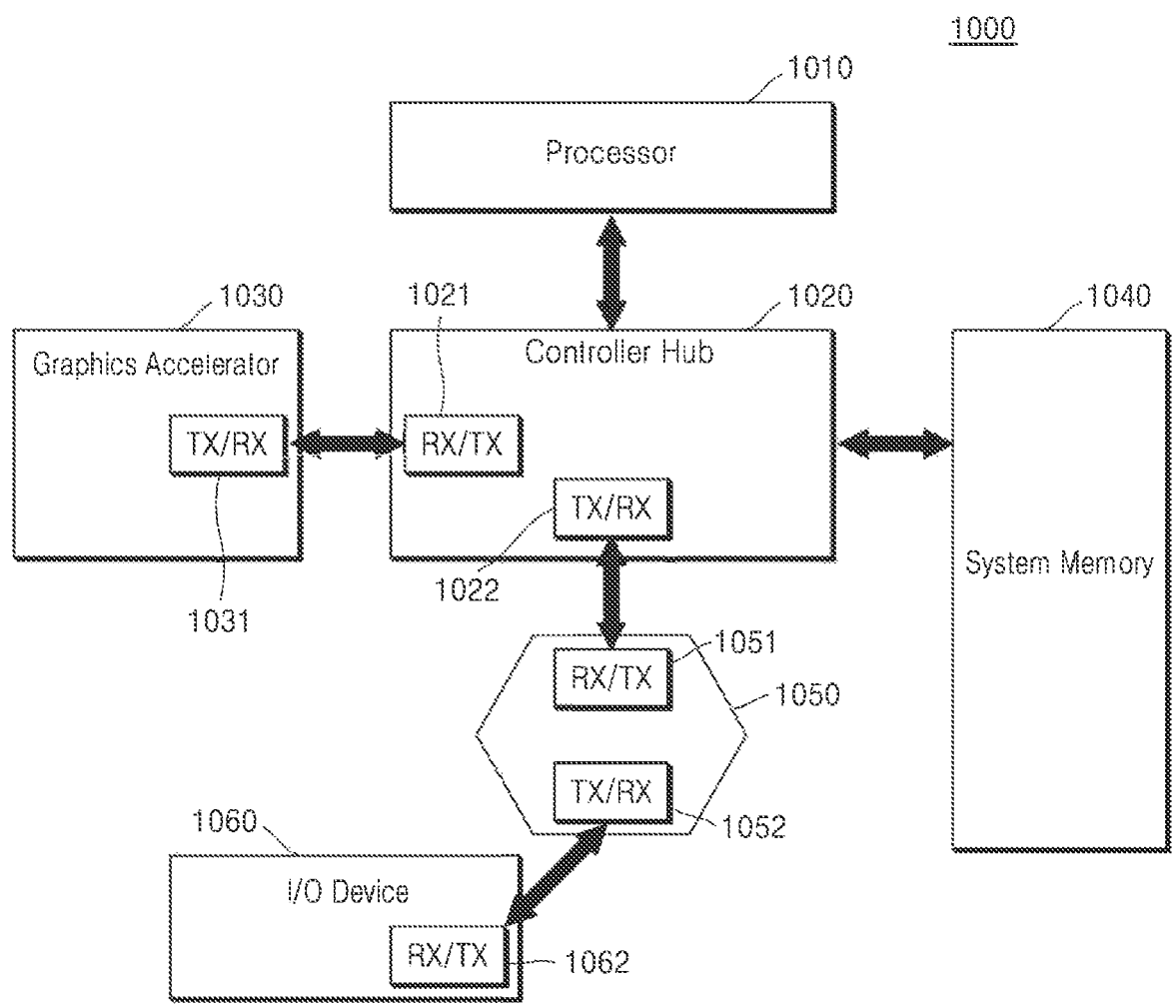
FIG. 17 is a block diagram illustrating a system to which example embodiments of the inventive concepts are applied.

FIG. 17 is a block diagram illustrating a system 1000 to which example embodiments of the inventive concepts are applied. Example embodiments of a fabric configured of point-to-point links interconnecting a set of configuration elements are applied to the system 1000.

Referring to FIG. 17, a processor 1010, a controller hub 1020, a graphics accelerator 1030, a system memory 1040, a switch/bridge 1050, and/or an input/output device 1060 may be provided. The processor 1010 may be connected to the controller hub 215 through a front-side bus. For example, the front-side bus may be a serial point-to-point interconnect.

The system memory 1020 may include any memory devices accessible from devices in the system 1000 such as a random access memory (RAM) and a nonvolatile memory. The system memory 1020 may be connected to the controller hub 1020 through a memory interface. For example, the memory interface may be any one of a double-data rate (DDR) memory interface, a dual channel DDR memory interface, and a dynamic RAM memory interface.

The controller hub 1020 may be any one of a root hub, a root complex, and a root controller in a PCIe interconnection layer. For example, the controller hub 1020 may include a chipset, a memory controller hub (MCH), a northbridge, an interconnect controller hub (ICH), a southbridge, and a root controller/hub.

The controller hub 1020 may be connected to the switch/bridge 1050 through a serial link. The transmitter/receiver 1022 and 1051 may be referred to as the interface/ports 1022 and 1051, and may include a protocol stack for providing communication between the controller hub 1020 and the switch/bridge 1050. The transmitter/receiver 1022 and 1051 may perform a link adaptation operation to which example embodiments of the inventive concepts are applied.

The switch/bridge 1050 may upstream packets/messages from the input/output device 1060 to the controller hub 1020 or downstream from the controller hub 1020 to the input/output device 1060. The switch/bridge 1050 may be referred to as a logical assembly of a plurality of virtual PCI-to-PCI bridge devices. The input/output device 1060 may be referred to a configuration element connected to an internal or external device, or an electronic system. The input/output device 1060 may be an endpoint device in the PCIe. The transmitter/receivers 1052 and 1062 may include a protocol stack for communication between the switch/bridge 1050 and the input/output device 1060, and example embodiments of the inventive concepts may be applied to perform the link adaptation operation.

The graphics accelerator 1030 may be connected to the controller hub 1020 through a serial link. The graphics accelerator 1030 may be connected to the MCH or the ICH.

The transmitter/receivers 1021 and 1031 may include a protocol stack for communication between the graphics accelerator 1030 and the controller hub 1020, and example embodiments of the inventive concepts may be applied to perform the link adaptation operation.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts have been particularly shown and described with reference to example embodiments thereof, it will be understood that various changes in form and details may be made therein without departing from the spirit and scope of the following claims.

What is claimed is:

1. An integrated circuit comprising:
 a receiver configured to receive a first data signal based on an $m^{th}$ (where m is an integer greater than or equal to 1) transmitter preset setting among a plurality of transmitter preset settings through an external link, and equalize and sample the first data signal;
 a receiver setting table including a plurality of combinations including values of a plurality of parameters related to the receiver; and
 a receiver control circuit configured to sequentially select the plurality of combinations with reference to the receiver setting table and set the plurality of parameters with the selected combinations,
 wherein the receiver control circuit, as the plurality of parameters are sequentially set in the plurality of combinations, selects a combination mapped to the $m^{th}$ transmitter preset setting from among the plurality of combinations based on eye opening specifications of a plurality of second data signals output from the receiver.

2. The integrated circuit of claim 1, wherein the receiver includes at least one of a passive equalizer, a continuous time linear equalizer, a variable gain amplifier, a decision feedback equalizer, and a clock/data recovery circuit, corresponding to the plurality of parameters.

3. The integrated circuit of claim 1, wherein the plurality of combinations are classified by a plurality of standards configured to be supportable by the integrated circuit.

4. The integrated circuit of claim 3, wherein the receiver control circuit, is configured to set the plurality of parameters from the plurality of combinations by using at least one combination that satisfies a selected standard among the plurality of standards.

5. The integrated circuit of claim 1, wherein the eye opening specifications include information related to worse side widths of each of eye patterns of the plurality of second data signals, and
 wherein the receiver control circuit is configured to map a combination corresponding to a one-side width of a best condition among the worse side widths from the plurality of combinations to the $m^{th}$ transmitter preset setting, with reference to the information.

6. The integrated circuit of claim 5, wherein the receiver control circuit is configured to measure left widths and right widths of the eye patterns divided around a sampling point in each of the eye patterns by using a target bit error rate, and sort the worse one-side widths from the measured left widths and the measured right widths.

7. The integrated circuit of claim 6, wherein the receiver control circuit is configured to select the worse one-side widths based on bit error rates corresponding to each of the measured left widths and the measured right widths.

8. The integrated circuit of claim 1, wherein the eye opening specifications include information related to worse representative predicted intercept values in each of eye patterns of the plurality of second data signals, and
 wherein the receiver control circuit is configured to map a combination corresponding to a representative predicted intercept value of a best condition among the worse representative predicted intercept values from the plurality of combinations to the $m^{th}$ transmitter preset setting, with reference to the information.

9. The integrated circuit of claim 8, wherein the receiver control circuit is further configured to measure first predicted intercept values and second predicted intercept values corresponding to each of left patterns and right patterns of the eye patterns divided around each sampling point in the eye patterns of the plurality of second data signals, and sort the worse representative predicted intercept values from the measured first and second predicted intercept values.

10. The integrated circuit of claim 1, further comprising:
 a figure of merit (FOM) mapper configured to receive the $m^{th}$ signal related to the eye opening specifications corresponding to the selected combination from the receiver control circuit, and convert the $m^{th}$ signal into an $m^{th}$ FOM signal having a predetermined format.

11. The integrated circuit of claim 10, further comprising:
 a controller configured to generate a feedback signal indicating a transmitter preset setting included in an optimal pair between the plurality of transmitter preset settings and the plurality of combinations based on a plurality of FOM signals including the $m^{th}$ FOM signal from the FOM mapper, to output the feedback signal to an external destination.

12. The integrated circuit of claim 1, further comprising:
 a sampling point adjuster configured to adjust a sampling point of a third data signal received through the external link and output from the receiver to be located at a center of an eye pattern of the third data signal in an optimal pair between the plurality of transmitter preset settings and the plurality of combinations.

13. The integrated circuit of claim 12, wherein the receiver includes a clock/data recovery circuit configured to generate an In-phase (I)-clock signal and a Quadrature (Q)-clock signal for a sampling operation, and
 wherein the sampling point adjuster is configured to provide a phase offset to the clock/data recovery circuit to change a phase difference between the I-clock signal and the Q-clock signal.

14. The integrated circuit of claim 1, wherein the receiver includes a clock/data recovery circuit configured to generate an error clock signal for monitoring the eye opening specifications, and
 wherein the receiver control circuit, is configured to generate the eye opening specifications based on a phase code provided to the clock/data recovery circuit to change a phase of the error clock signal.

15. An integrated circuit comprising:
 a receiver configured to sequentially receive a plurality of first data signals based on each of a plurality of transmitter preset settings through an external link, equalize and sample the first data signals, and output a plurality of second data signals;

a receiver setting table including a plurality of combinations including values of a plurality of parameters related to the receiver; and a receiver control circuit configured to sequentially select the plurality of combinations with reference to the receiver setting table, set a plurality of parameters with the selected combinations, generate a phase code for checking eye opening specifications of the plurality of second data signals, and provide the phase code to the receiver, wherein the receiver control circuit is configured to change a value of the phase code, compare a first bit error rate according to the changed value of the phase code with a target bit error rate, and generate eye opening specifications of the plurality of second data signals based on a result of the comparison of the first bit error rate with the target bit error rate.

16. The integrated circuit of claim 15, wherein the eye opening specifications include information related to worse one-side widths in eye patterns of each of the plurality of second data signals, and wherein the receiver control circuit is configured to map a combination corresponding to a one-side width of a best state among the worse one-side widths of each of the plurality of transmitter preset settings with reference to the information.

17. The integrated circuit of claim 16, wherein the information further includes second bit error rates corresponding to each of the worse side widths, and wherein the receiver control circuit; is configured to compare states of first side widths with reference to the second bit error rates with respect to the first side widths having the same value among the worse side widths.

18. The integrated circuit of claim 15, further comprising:

a figure of merit (FOM) mapper configured to receive a plurality of signals related to the eye opening specifications corresponding to optimal combinations mapped to each of the plurality of transmitter preset settings from the receiver control circuit, and convert the plurality of signals into a plurality of FOM signals having a predetermined format.

19. The integrated circuit of claim 18, further comprising:

a controller configured to generate a feedback signal indicating a transmitter preset setting included in an optimal pair between the plurality of transmitter preset settings and the plurality of combinations based on the plurality of FOM signals from the FOM mapper, to output the feedback signal to an external destination.

20. An operation method of an integrated circuit, the method comprising:

receiving a first data signal based on an $m^{th}$ (where m is an integer greater than or equal to 1) transmitter preset setting among a plurality of transmitter preset settings through a receiver;

sequentially selecting a plurality of combinations including values of a plurality of parameters related to the receiver and setting the plurality of parameters as the selected combinations;

monitoring eye opening specifications of a plurality of second data signals based on a bit error rate, the second data signals generated based on the first data signal and a phase code; and selecting a combination mapped to the $m^{th}$ transmitter preset setting among the plurality of combinations based on a result of the monitoring.

* * * * *